(12) United States Patent
Barrow et al.

(10) Patent No.: US 8,085,180 B2
(45) Date of Patent: Dec. 27, 2011

(54) APPARATUSES AND METHODS FOR MULTIPLE-OUTPUT COMPARATORS AND ANALOG-TO-DIGITAL CONVERTERS

(75) Inventors: Jeffrey G. Barrow, Tucson, AZ (US); Benjamin O. Barrow, Tucson, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/714,042

(22) Filed: Feb. 26, 2010

(65) Prior Publication Data

US 2011/0210878 A1     Sep. 1, 2011

(51) Int. Cl.
*H03M 1/34* (2006.01)
(52) U.S. Cl. ......................... 341/158; 341/159
(58) Field of Classification Search .................. 341/156, 341/158, 159
See application file for complete search history.

(56) References Cited

U.S. PATENT DOCUMENTS

| | | | | |
|---|---|---|---|---|
| 4,870,417 A | * | 9/1989 | van de Plassche et al. | 341/118 |
| 5,157,397 A | * | 10/1992 | Vernon | 341/159 |
| 5,420,587 A | * | 5/1995 | Michel | 341/156 |
| 6,239,733 B1 | * | 5/2001 | Lin | 341/159 |
| 6,628,224 B1 | * | 9/2003 | Mulder et al. | 341/156 |

OTHER PUBLICATIONS

Pileggi et al., "Mismatch Analysis and Statistical Design at 65 nm and Below," IEEE 2008 Custom Integrated Circuits Conference (CICC), pp. 2-2-1 to 2-2-4.
Pelgrom et al., "Matching Properties of MOS Transistors," IEEE Journal of Solid State Circuits, vol. 24, No. 5, Oct. 1989, pp. 1433-1440.

* cited by examiner

*Primary Examiner* — Khai M Nguyen
(74) *Attorney, Agent, or Firm* — TraskBritt P.C.

(57) ABSTRACT

An analog-to-digital converter with comparators with multiple, inter-coupled, outputs is provided, which may be also called a Benorion Analog-to-Digital Converter (ADC) or a Benorion Converter. The analog-to-digital converter includes a plurality of comparators operably coupled for receiving an analog input signal and configured for comparing the analog input signal with a plurality of voltage reference signals. Each comparator of the plurality is configured for generating a plurality of comparator outputs comprising a primary comparator output, and at least one additional comparator output selected from the group consisting of positive comparator outputs and negative comparator. The analog-to-digital converter further includes a plurality of composite outputs, each composite output of the plurality comprising a combination of the primary comparator output from a corresponding comparator of the plurality and at least one additional comparator output from at least one additional comparator of the plurality of comparators. Other comparators and methods are provided.

24 Claims, 18 Drawing Sheets

APPARATUSES AND METHODS FOR MULTIPLE-OUTPUT COMPARATORS AND ANALOG-TO-DIGITAL CONVERTERS

TECHNICAL FIELD

Embodiments of the present disclosure relate generally to comparators, analog-to-digital conversion and, more particularly, to apparatuses and methods related to multiple-output comparators and analog-to-digital conversion with multiple-output comparators.

BACKGROUND

An analog-to-digital converter (ADC) is an important electronic building block that links real-world signals to the powerful capabilities of digital processing. Because analog signals may vary so widely over amplitude, frequency, and other requirements, a multitude of different ADC architectures have been developed. ADCs may be configured based on certain desired end-user application requirements, such as resolution, dynamic range, conversion rate, integral and differential linearity, power dissipation, accuracy, bandwidth, conversion delay, cost, package pin count, supply voltage range, or many other characteristics related to performance of the ADC. Desired end-user application requirements may be matched with an ADC's characteristics to achieve an appropriate conversion solution.

Different ADCs may be suitable for a particular problem set. For example, conventional flash ADCs may be relatively fast and therefore suitable for high-speed signals, such as in applications where the ADC is part of a high-speed closed loop system where small conversion delay is needed in the feedback path for digital processing and control. One disadvantage of conventional flash ADCs is that they may consume relatively high power. Additionally, conventional flash ADCs may be limited to bipolar junction transistor (BJT) technologies because of transistor mismatch errors, as will be explained herein. Because most conventional flash ADCs are based on BJT technology, the die size (i.e., footprint) of the conventional flash ADC may be relatively large and can be relatively expensive to manufacture.

Other ADC configurations may be suited for different applications. For example, successive-approximation ADCs operate by comparing the input voltage to the output of an internal digital-to-analog converter (DAC) until the best approximation is achieved. Successive-approximation ADCs may cure some of the deficiencies of the conventional flash ADC in that the successive-approximation ADC may be manufactured using advanced CMOS technologies, thus reducing the amount of silicon area consumed; however, the conversion rates for successive-approximation ADCs are an inverse function of resolution. Therefore, successive-approximation ADCs may not be suitable for applications that require fast conversion, but may be desirable for applications requiring small die size, for which conversion rate is of lesser importance.

Integrating ADCs apply an input voltage to the input of an integrator in order to ramp until the input integrator output returns to zero. Like the successive-approximation ADC, integrating ADCs can have high resolution, but are also relatively slow. However, one advantage of the integrating ADC is low power dissipation. Therefore, integrating ADCs may be desirable when low power dissipation is an important parameter, but conversion rate is not. Other ADC configurations exist that are not described herein, each configuration with advantages and disadvantages that may influence the selection of the ADC for a particular application. As an example, a configuration of a conventional flash ADC will be described for illustrative purposes.

FIG. 1 illustrates a simplified block diagram for a conventional flash analog-to-digital converter 100. Conventional flash ADC 100 includes a comparator string 110, a resistor string 120, and a decoder 130. Resistor string 120 includes individual resistors (R) connected in series between voltage references $V_{REF1}$ and $V_{REF2}$. The comparator string 110 includes individual comparators (Cp) in series in which one input to each individual comparator (Cp) of the comparator string 110 is operably coupled to an analog input signal $V_{IN}$, and another input to each individual comparator (Cp) is operably coupled to intermediate voltage references located at nodes between the individual resistors (R) of the resistor string 120. Analog input signal $V_{IN}$ may simply be referred to herein as "$V_{IN}$." The outputs from each individual comparator (Cp) of the comparator string 110 are operably coupled to a decoder 130, which generates a digital output signal 135. Code block 125 is illustrated for ease of description and will be discussed later.

The number of resistors in the resistor string 120 is $2^N$, where "N" refers to the resolution (i.e., number of bits) of the ADC. The number of individual comparators (Cp) in the comparator string 110 is $2^N-1$. For example, a 6-bit flash ADC has 64 resistors and 63 comparators. Likewise, an 8-bit flash ADC has 256 resistors and 255 comparators, and so on. The intermediate voltage references between serially connected resistors, and input into one of the individual comparators (Cp) of the comparator string 110, are one less significant bit (LSB) greater than the reference voltage for the comparator below it. As used in the context of outputs (i.e., codes) and voltage references, LSB refers to the voltage references input into the comparator string 110, which translates into a corresponding code output from an individual comparator (Cp) of the comparator string 110. Later in this discussion, LSB may be referred to as a specific voltage level, which is intended to refer to the difference between adjacent voltage reference signals input into the comparator string 110.

In operation, when $V_{IN}$ is applied, each individual comparator (Cp) in the comparator string 110 compares $V_{IN}$ with the voltage reference signal corresponding to the particular individual comparator (Cp). If $V_{IN}$ increases to a level above the voltage level of the voltage reference signal of a particular individual comparator (Cp), then the output of the particular individual comparator (Cp) is asserted (e.g., 1). If $V_{IN}$ is at a voltage level below the voltage level of the voltage reference signal of a particular individual comparator (Cp), then the output of the particular comparator (Cp) is not asserted (e.g., 0). The code block 125 merely represents the state (e.g., asserted, not asserted) of the outputs (i.e., codes) of the individual comparators (Cp). While there may be additional circuitry or other components between the comparator string 110 and decoder 130, code block 125 itself should not be viewed as a physical component.

For this example, it is assumed that $V_{REF1}$ is greater than $V_{REF2}$, and that the intermediate voltage references between $V_{REF1}$ and $V_{REF2}$ decrease from $V_{REF1}$ to $V_{REF2}$ such that the outputs near the bottom of conventional flash ADC 100 are asserted first as $V_{IN}$ increases. The code block 125 may be thought of as the number of codes being asserted rises as voltage level of $V_{IN}$ increases, in a manner similar to a thermometer rising as temperature rises.

In FIG. 1, code block 125 illustrates the outputs from the bottom four individual comparators (Cp) to be asserted while the outputs from the top four individual comparators (Cp) are not asserted, indicating that $V_{IN}$ is at a voltage level greater than the voltage reference signals to the bottom four individual comparators (Cp) and lesser than the voltage reference signals to voltage reference signals to the top four individual comparators (Cp). The decoder 130 includes internal logic that converts the codes from the code block 125 into a digital output signal 135.

Individual comparators (Cp) in comparator string 110 of a conventional flash ADC 100 are generally configured using BJTs for reasons that will be discussed. A conventional flash ADC 100 may take advantage of BJTs comparatively good matching properties and relatively high transconductance for desirable comparator performance for certain applications. However, even the smallest BJTs may be relatively large (in comparison to other processes such as CMOS) and may consume considerable silicon area, thereby resulting in relatively large components and high manufacturing cost. Additionally, BJTs draw a parasitic base current through the resistor string 120 resulting in an accumulation of error that reduces accuracy. Designers may construct the resistor string 120 from metal such as aluminum, gold, or copper in an attempt to reduce the resulting error caused by this parasitic base current. However, a tradeoff may result as a low value resistance between $V_{REF1}$ to $V_{REF2}$ also results in high current flow through resistor string 120, and therefore may adversely contribute to power dissipation.

The combination of $2^N$ BJT base terminals on a single $V_{IN}$ node also contributes to a large parasitic input capacitance. This parasitic input capacitance may be undesirable because a flash ADC is often used in high frequency applications. To achieve certain desired performance, BJTs may be biased with large bias current, which may range from approximately 100 microamps to several milliamps. For a successive-approximation ADC, where a single comparator is used over and over, such a large bias current may not result in significant problems; however, in a flash ADC, the parallel construction of the individual comparators (Cp) multiplies the large bias current by the resolution of the ADC. Because BJT performance drops when in saturation, the supply voltage range may be required to be sufficiently large enough for operation in the active region. This supply voltage (e.g., 5 V or higher) multiplied by the large bias current (e.g., 100s of mA) may result in an undesirably high power dissipation.

Despite the less desirable characteristics of the conventional flash ADC 100 discussed above, the flash ADC with BJTs remains the primary choice of designers for high frequency analog-to-digital conversion. Mere substitution of the BJTs in the comparators of comparator string 110 for sub-micron CMOS technology in a flash comparator may have relatively high speed, low power, low input capacitance, and low cost because of the smaller footprint; however, problems associated with transistor matching between CMOS transistors may be too great in comparison with matching between BJT transistors (see Table 1 below). The undesired mismatch may cause unacceptable differential non-linearity (DNL) errors. The DNL errors may be so large that entire codes may become missing or misplaced.

FIGS. 2A-2C show graphs illustrating various outputs 200, 225, 250 of a conventional flash analog-to-digital converter. For example, FIG. 2A illustrates an ideal output of a conventional flash ADC as $V_{IN}$ increases linearly from a low voltage to a high voltage. Codes 1 through "m" correspond to outputs of the comparator string, which are input into a decoder. FIG. 2B illustrates outputs of a conventional flash ADC as $V_{IN}$ increases linearly from a low voltage to a high voltage, in which one code (code j) experiences a DNL error. FIG. 2C illustrates outputs of a conventional flash ADC as $V_{IN}$ increases linearly from a low voltage to a high voltage, in which one code (code j) is missing or is misplaced. Each of the misbehaving bits may be a result of transistor mismatch from one of the many transistors of the conventional flash ADC (e.g., transistors in the comparators, load transistors, etc.). Because mismatch is greater in CMOS transistors in comparison to BJTs, these errors caused by the misbehaving bits illustrated by FIGS. 2B and 2C are more likely to occur.

FIGS. 3A and 3B illustrate configurations of comparators 300, 350, such as those used in a comparator string of a conventional flash analog-to-digital converter, using BJT and CMOS processes, respectively. FIG. 3A illustrates a comparator 300 according to a BJT process. FIG. 3B illustrates a comparator 350 according to a CMOS process. In both cases, the comparators 300, 350 are configured such that an output voltage at node $V_{OUT}$ is low when $V_{IN}$ is greater than $V_{REF}$. However, the differences in comparators 300, 350 will be highlighted during the discussion below.

Those skilled in the art may be aware that increased gate area improves CMOS matching. For example, transistor matching in CMOS processes can be approximated by simplified Pelgrom's equations for variance ($\sigma^2(\Delta P)$) and standard deviation ($\sigma(\Delta P)$) for a process parameter P (e.g., voltage) between two circuit elements:

$$\sigma^2(\Delta P) \approx AP^2/WL \rightarrow \sigma(\Delta P) \approx AP/\sqrt{(WL)} \quad (1).$$

Therefore, transistor matching is inversely proportional to the square root of gate area (WL). For improved transistor matching, the standard deviation $\sigma(\Delta P)$ should be minimized for improved DNL errors. However, improving transistor matching may cause degradation to conversion speed. In order to avoid degrading conversion speed, the following analysis guides the transistor design geometry.

Conversion speed (T) can be approximated by gate capacitance (C) multiplied by channel resistance (R). Gate capacitance is approximated as $C \approx \epsilon WL/tox$. Channel resistance is approximated by $R \approx \rho L/W$. Therefore, conversion speed is $T=RC \approx \rho L/W * \epsilon WL/tox = \rho \epsilon L^2/tox$. Conversion speed may be written as:

$$T \approx \beta L^2, \text{ where } \beta = \rho \epsilon / tox \quad (2).$$

Conversion speed (T) is, therefore, proportional to the square of the gate length (L) and is not a function of gate width (W). For the fastest speed, design goals may include minimizing the conversion speed (T) for high-speed operation by using the smallest possible gate length (L). Therefore, conversion speed and DNL can be managed independently. An improved (i.e., reduced) conversion speed (T) with a suitable DNL may be achieved by making gate length (L) small and gate width (W) large. Gate length (L) and width (W) can be independently chosen to improve both speed and matching. For example, an NMOS transistor may have a standard deviation of 30 mV for a 0.18 μm×0.8 μm gate in a CMOS process. A PMOS transistor may have a standard deviation of 40 mV for a 0.18 μm×0.8 μm gate in a CMOS process. A basic, conventional comparator used in a conventional flash ADC may have four NMOS and two PMOS transistors.

$$\sigma = \sqrt{(\sigma n^2 + \sigma n^2 + \sigma n^2 + \sigma n^2 \sigma p^2 + \sigma p^2)} = \sqrt{[4(30^2) + 2(40^2)]}$$
$$= 82.5 \text{ mV} \quad (3).$$

As a further example, 1 LSB may equal about 6 mV. In that case, a minimum geometry design such as the one listed above may produce 14 LSB code misplacements. As another example, 1 LSB=6 mV and the design goal is to reduce DNL (i.e., transistor matching, standard deviation) to be about ½ LSB (i.e., 3 mV). In this example, the required gate width (W) may be solved by Pelgrom's Equation for standard deviation:

$$3 \text{ mV} = \sigma = \sqrt{[4A_n P^2/(WL) + 2A_p P^2/(WL)]} \approx 60/\sqrt{W} \quad (4).$$

$A_nP$ and $A_pP$ are the proportionality constants for the NMOS and PMOS transistors, respectively, and are assumed to be 10 mV and 12 mV, respectively in this example. It is noted that $A_nP$ and $A_pP$ are process and foundry dependent parameters; however, for the values given above are used in 0.18 μm CMOS processes, which is used as an example herein. Therefore, when solving for gate width (W), the gate width (W) is required to be approximately 400 μm wide for a ½ LSB DNL if the LSB is 6 mV for a conventional flash ADC using 0.18 μm gate length CMOS transistors. This transistor size is relatively very large and consumes a very large silicon area.

In other words, gate width (W) can be increased to improve comparator matching without degrading AC performance or decreasing the available linear range for combining adjacent comparator outputs. However, an increase in gate width (W) causes the current to proportionally increase to maintain the AC performance. For example, to maintain proper bias, each transistor may operate at a much higher operating current than a minimum geometry transistor (e.g., 0.18 μm×0.8 μm). Increasing the operating current may also increase the power dissipated by the conventional flash ADC by an undesirable amount. Thus, increasing gate width (W) to improve linearity has a power and die-size disadvantage. Consequently, a conventional flash ADC constructed using sub-micron CMOS transistors may be impractical.

Table 1, shows typical mismatch and DNL errors for different transistor types.

TABLE 1

| Transistor Type | Typical Mismatch | DNL Error w/6 mV LSB |
| --- | --- | --- |
| NPN - BJT | <2 mV | ⅓ LSB |
| NMOS 0.18 μm × 0.8 μm | 30 mV | 5 LSB |
| NMOS 1 μm × 1 μm | 9 mV | 1.5 LSB |
| PMOS 0.18 μm × 0.8 μm | 40 mV | 7 LSB |
| PMOS 1 μm × 1 μm | 12 mV | 2 LSB |

In Table 1, it should be noted that 1σ matching when the LSB is 6 mV for the BJT design is about ⅓ LSB, while for the CMOS design 1σ matching may be as high as 7 LSBs. Given that an 8-bit converter has 255 parallel comparators, it may be reasonable to expect 3σ or higher variation, therefore a conventional flash ADC with 0.18 μm CMOS transistors may reasonably be expected have a few codes with greater than 21 LSBs of code misplacement error. Therefore, construction of a conventional flash ADC with sub-micron, minimum geometry CMOS transistors may not meet many application requirements.

Table 2 illustrates a side-to-side comparison between conventional BJT and CMOS flash ADC design. As seen in Table 2, BJTs have a lower standard deviation and DNL than a CMOS transistor. For this reason, and those described above regarding CMOS processes, BJT processes are generally used for conventional flash ADCs. However, as shown by Table 2, BJTs may have undesirable characteristics in comparison with CMOS including, higher power dissipation, larger silicon consumption and increased cost, and a lack of mixed signal monolithic capability.

TABLE 2

| Parameter | BJT | CMOS |
| --- | --- | --- |
| DNL | 2 mV | 30 mV |
| Power Dissipation | High Power | Lower Power |

TABLE 2-continued

| Parameter | BJT | CMOS |
| --- | --- | --- |
| Cost | High Cost | Low Cost |
| Conversion Rate | Fast | Fast |
| Mixed Signal Monolithic Compatibility | No | Yes |

The inventor has appreciated that there exists a need for a method and apparatus for analog-to-digital conversion which may include one or more of the following parameters: relatively fast conversion rate, low conversion latency (i.e., propagation delay), low cost, low input bias current, low input capacitance and low power dissipation, which may improve upon some of the limitations of conventional ADCs, including conventional bipolar junction flash ADCs, successive-approximation ADCs and integrating ADCs.

BRIEF SUMMARY OF THE INVENTION

Embodiments of the present invention include an analog-to-digital converter. The analog-to-digital converter comprises a plurality of comparators operably coupled for receiving an analog input signal and configured for comparing the analog input signal with a plurality of voltage reference signals. Each comparator of the plurality is configured for generating a plurality of comparator outputs comprising a primary comparator output, and at least one additional comparator output selected from the group consisting of positive comparator outputs and negative comparator outputs. The analog-to-digital converter comprises a plurality of composite outputs, each composite output of the plurality comprising a combination of the primary comparator output from a corresponding comparator of the plurality and at least one additional comparator output from at least one additional comparator of the plurality of comparators.

Another embodiment of the present invention includes a comparator for comparing two input signals. The comparator comprises a first input line operably coupled to a first transistor, a second input line operably coupled with the first transistor, and a plurality of output lines coupled with the first transistor and second transistor. The first transistor and second transistor are configured to generate currents on the plurality of output lines when the first input line has a voltage level greater than the second input line, wherein a current direction of at least one individual output line of the plurality is different than a direction of at least one other individual output line of the plurality.

In yet another embodiment of the present invention, a method for converting an analog signal to a digital signal is provided. The method includes comparing an analog input signal with a plurality of voltage reference signals to generate a plurality of primary output signals and a plurality of additional output signals corresponding to individual comparators of a plurality of comparators, summing individual primary output signals corresponding to individual comparators with other additional output signals corresponding to at least one other individual comparator of the plurality, and generating a plurality of composite output signals responsive to the summing of individual primary output signals with the other additional output signals.

DETAILED DESCRIPTION

Figure 1:
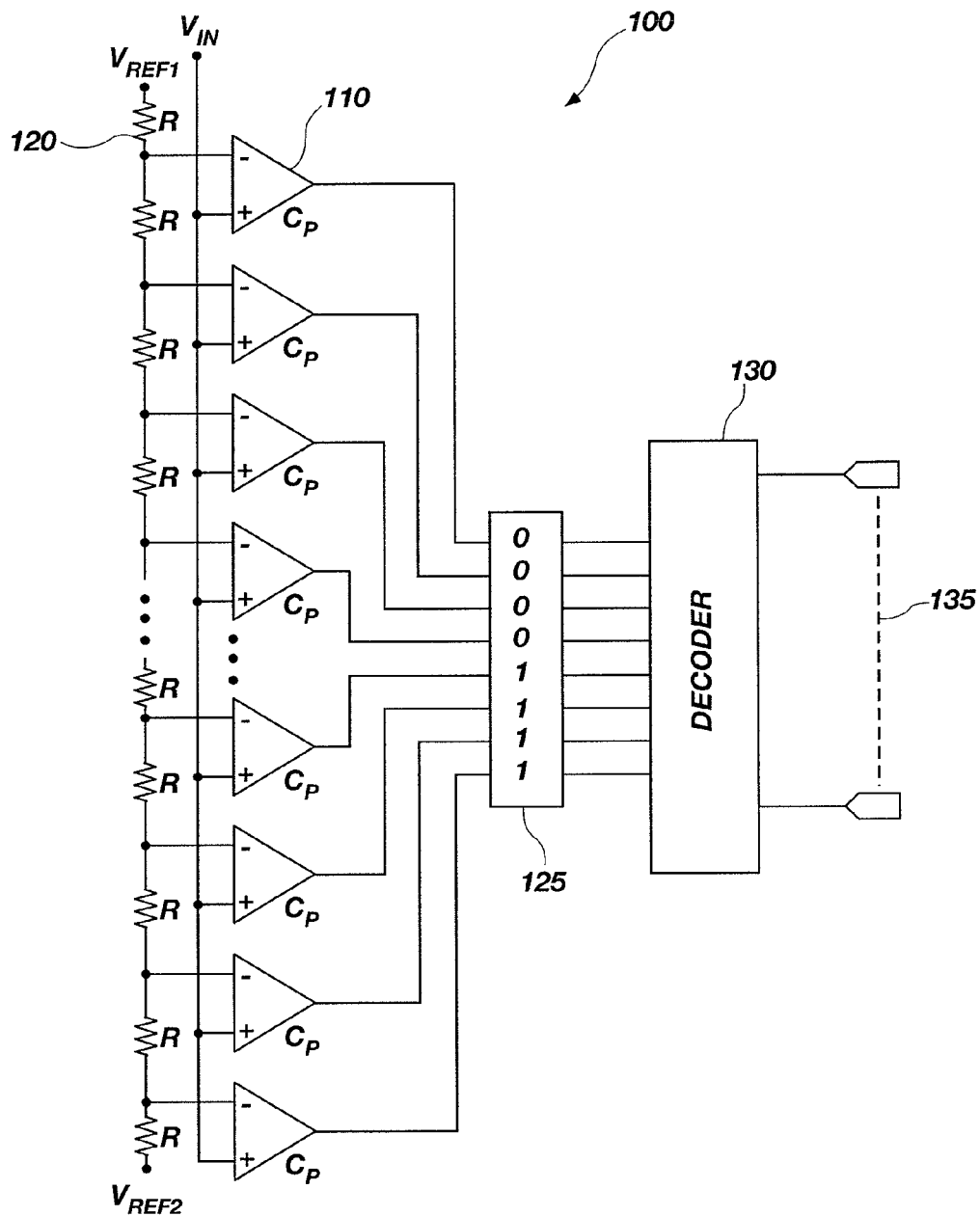
FIG. 1 illustrates a simplified block diagram for a conventional flash analog-to-digital converter.
Figure 2A:
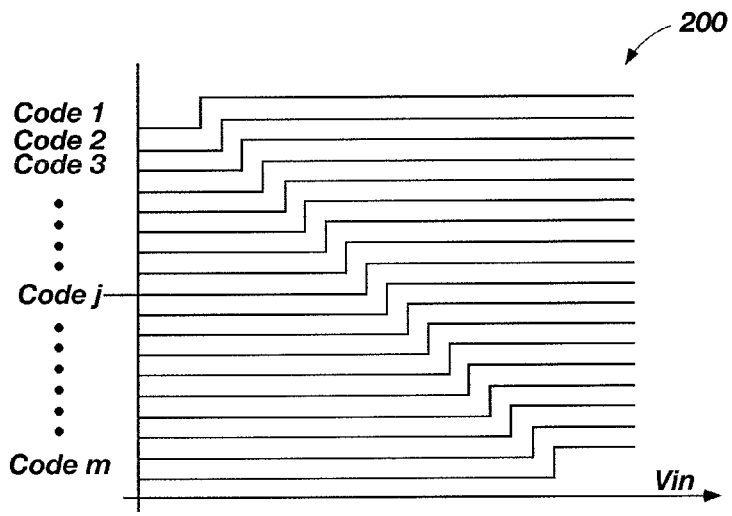
FIGS. 2A-2C show graphs illustrating various outputs of a conventional flash analog-to-digital converter.
Figure 2B:
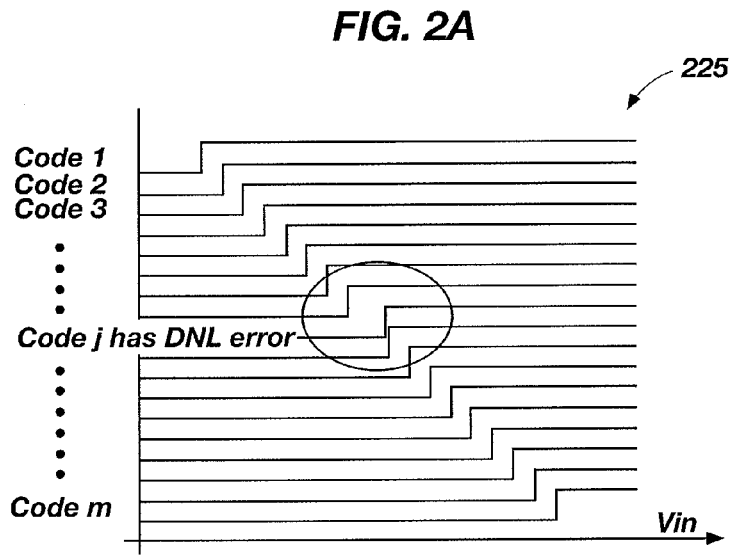
Figure 2C:
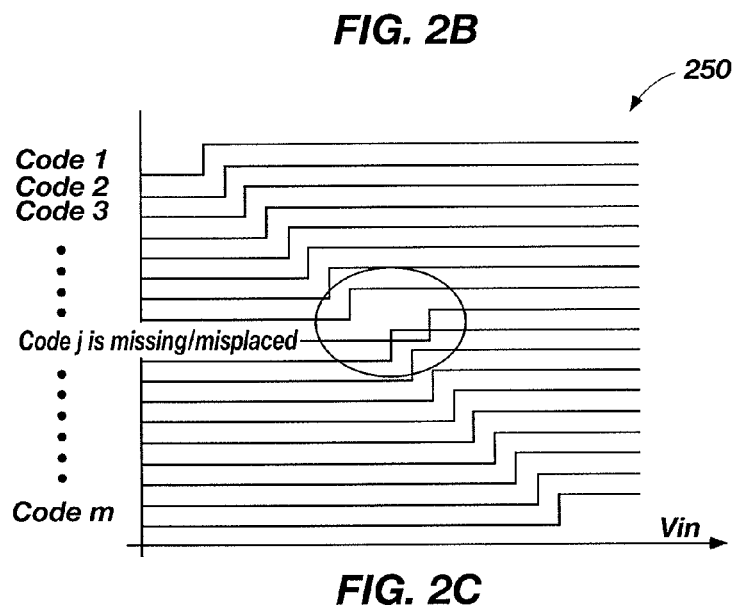
Figure 3A:
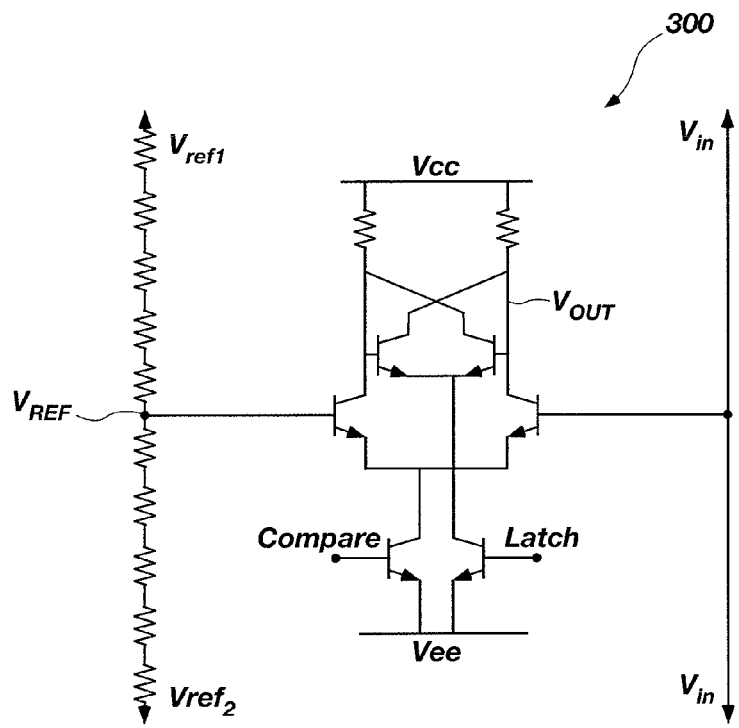
FIGS. 3A and 3B illustrate configurations of comparators, such as those used in a comparator string of a conventional flash analog-to-digital converter, using BJT or CMOS processes.
Figure 3B:
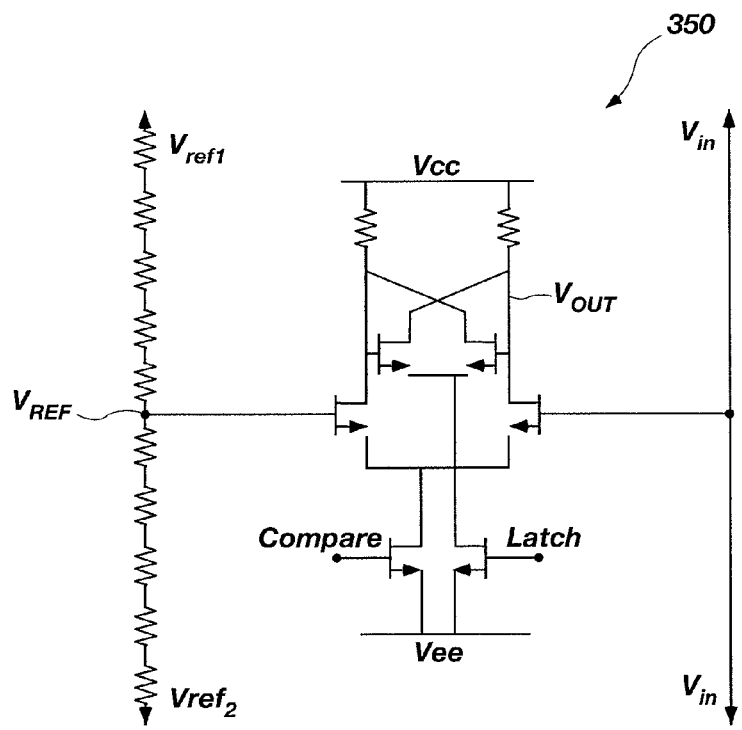

Embodiments of the present disclosure include apparatuses and methods for comparing two signals, for analog-to-digital conversion, and in which a new ADC is introduced. This new ADC may be called a Benorion ADC or Benorion Converter. "Benorion" is intended to be used as a title for a new type of converter. The term, "Benorion," has not previously been used in ADCs and should not be interpreted to have any prior meaning or functionality not related to that which is described herein through the various examples, as defined in the claims, and by their legal equivalents.

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description of embodiments of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

Those of skill would further appreciate that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the invention described herein.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Figure 4A:
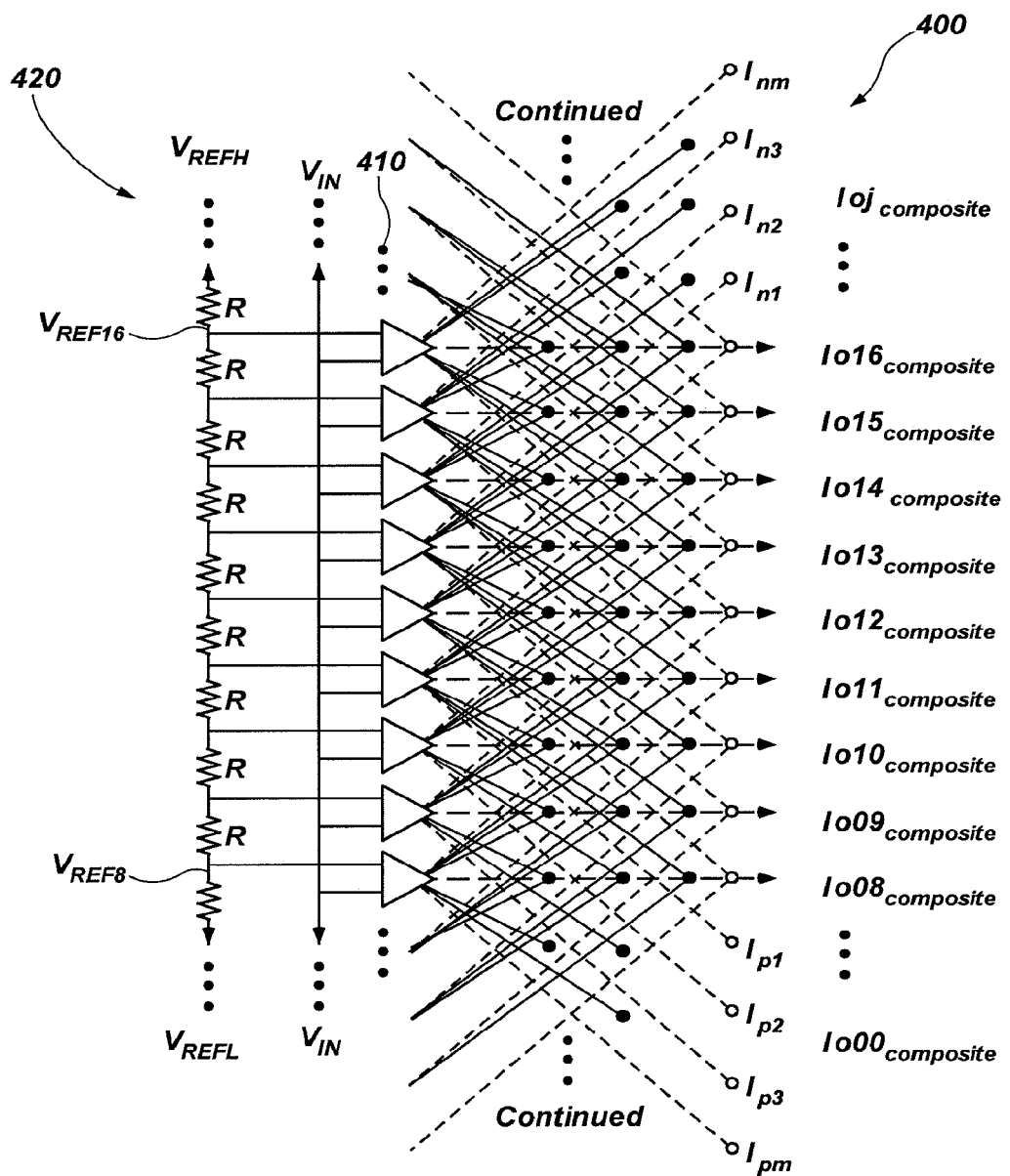
FIG. 4A illustrates an analog-to-digital converter according to an embodiment of the present invention.

FIG. 4A illustrates an analog-to-digital converter 400 according to an embodiment of the present invention. Analog-to-digital converter 400 includes a comparator string 410 with a plurality of comparators. Each of the individual comparators (Cp) in the comparator string 410 receives as inputs an analog input signal $V_{IN}$ and a voltage reference signal $V_{REFX}$.

The different voltage reference signals $V_{REFX}$ may be generated within a resistor string 420. The "$_x$" is an index referring to a number of a specific voltage reference signal (e.g., $V_{REF8}$, $V_{REF16}$). The resistor string 420 may include individual resistors (R) operably coupled in series between a high voltage reference signal $V_{REFH}$ and a low voltage reference signal $V_{REFL}$. For a resistor string 420 there may generally be one resistor for every LSB that generates a voltage reference signal $V_{REFX}$ for an input to an individual comparator (Cp) of the comparator string 410 to be compared with $V_{IN}$ at the other input of the individual comparator (Cp) of the comparator string 410. Although intermediate voltage references (e.g., $V_{REF8}$-$V_{REF16}$) are shown herein as being generated at nodes along the resistor string 420 between high and low voltage reference signals $V_{REFH}$, $V_{REFL}$, other resistor or circuit configurations may likewise generate voltages reference signals $V_{REFX}$ to be compared to $V_{IN}$ by individual comparators (Cp) of comparator string 410.

Each of the individual comparators (Cp) in the comparator string 410 compares $V_{IN}$ with a voltage reference signal $V_{REFX}$ to generate a plurality of output signals (i.e., codes). Outputs from the individual comparators (Cp) of the comparator string 410 are coupled with at least one other output from another individual comparator (Cp). The combination of inter-coupled output signals forms a set of composite output signals $Ion_{compsite}$. For example, the eight individual comparators (Cp) shown in comparator string 410 in FIG. 4A have cross-coupled outputs (shown generally being output by each comparator and extending in both directions labeled $I_{N1}$-$I_{NM}$ and $I_{P1}$-$I_{PM}$) to generate composite outputs (e.g., $Io08_{composite}$ to $Io16_{composite}$). More or fewer composite outputs may be generated as is indicated by $Io00_{composite}$ and $Ioj_{composite}$ shown on each end of the composite output string.

Individual comparators (Cp) compare a single input (e.g., $V_{IN}$) with a voltage reference signal $V_{REFX}$ in a 1-dimensional manner. However, because individual comparators (Cp) have multiple outputs coupled with outputs from neighboring individual comparators (Cp), a second dimension of analog-to-digital conversion may be achieved. For example, if the transconductance of each individual comparator (Cp) is low enough for the outputs of neighboring interconnected individual comparators (Cp) to overlap in the linear region, then the collective response on a single composite output node determines a quasi analog-to-digital conversion. Therefore, if each of the individual comparators (Cp) is monotonic relative to neighboring comparators, any variance in a single bit (i.e., composite output signal) moves in a complimentary way relative to the neighboring bits, thus reducing or eliminating missing codes. For example, if a single bit misbehaves (i.e., acts differently) relative to the other bits, by cross coupling the outputs of the individual comparators (Cp) and summing the output signals together, the bits that are behaving properly may overpower the misbehaving bit. However, it should be noted that if all bits were to be off from normal operation, but were off in a manner similar to each of the bits, then each bit may maintain this monotonic behavior as each bit is averaged relative to the behavior of the neighboring bits. Thus, a misbehaving and a properly behaving bit may be viewed in light of the bit's behavior relative to the behavior of the neighboring bits.

Figure 4B:
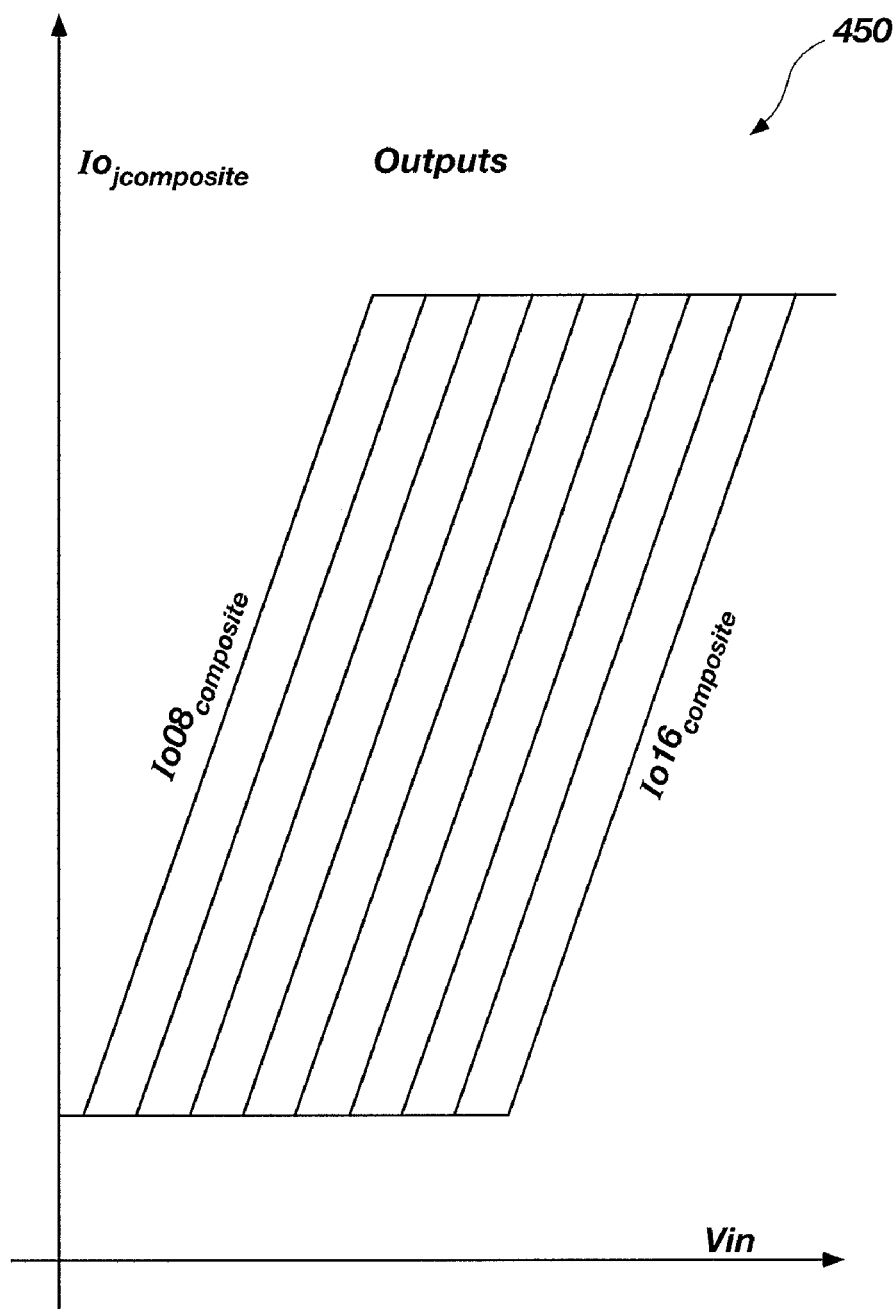
FIG. 4B illustrates a graph showing the composite output currents for the ADC from FIG. 4A according to an embodiment of the present invention.

FIG. 4B illustrates a graph 450 showing the composite outputs $Io08_{composite}$ to $Io16_{composite}$ for the ADC 400 from FIG. 4A according to an embodiment of the present invention. As $V_{IN}$ increases, the different composite outputs become asserted to generate a quasi-digital code. Because outputs from the individual comparators (Cp) of the comparator string 410 are coupled with at least one other output from another individual comparator (Cp), the composite outputs maintain a monotonic relationship relative to the other composite outputs.

Figure 5:
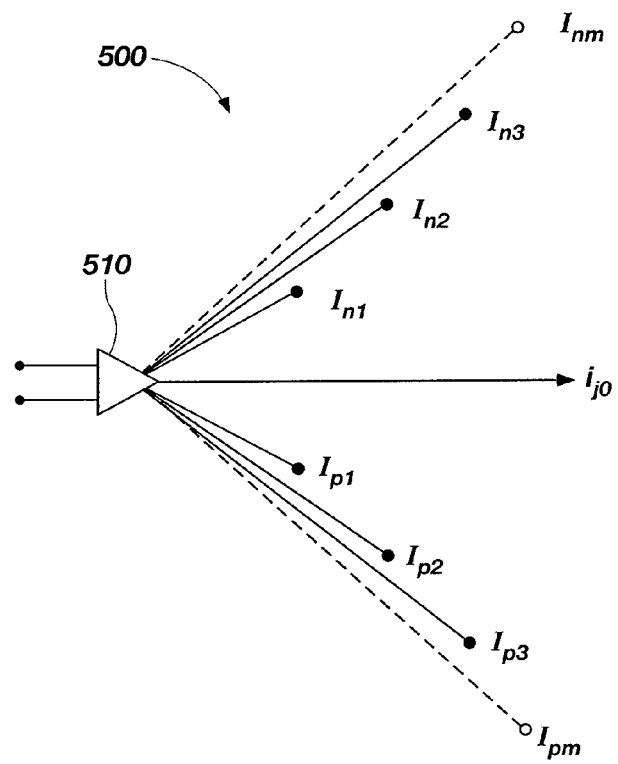
FIG. 5 shows an equivalent schematic diagram for a multiple-output comparator according to an embodiment of the present invention.

FIG. 5 shows an equivalent schematic diagram for a multiple-output comparator 500 according to an embodiment of the present invention. Multiple-output comparator 500 may be used as a comparator in a Benorion ADC. Multiple-output comparator 500 includes a comparator 510 that receives a single input (e.g., $V_{IN}$) to compare with a voltage reference (e.g., $V_{REF}$). Comparator 510 is configured to generate output signals responsive to the relationship of $V_{IN}$ and $V_{REF}$. For example, a primary output current (e.g., $I_{j0}$) is generated when V is greater than $V_{REF}$. Comparator 510 includes a plurality of additional output currents (e.g., $I_{n1}$-$I_{nm}$, $I_{p1}$-$I_{pm}$). These additional output currents may be coupled with outputs from other individual comparators in a comparator string (e.g., in an ADC) to generate composite outputs. Additionally, output current $I_{j0}$ may combine with other additional outputs from other individual comparators in a comparator string to generate a composite output.

Figure 6:
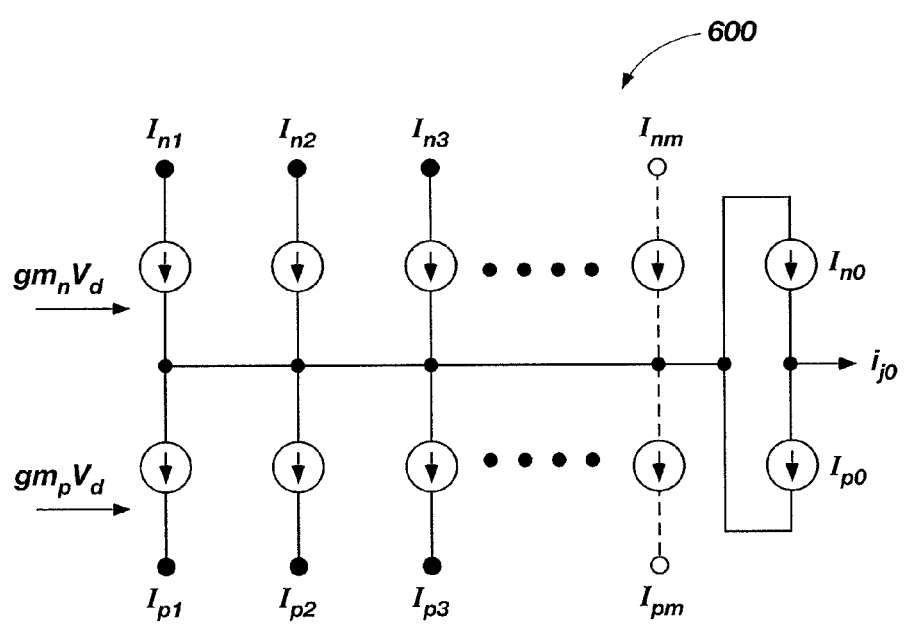
FIG. 6 shows an equivalent schematic diagram of output currents for a multiple-output comparator according to an embodiment of the present invention.

FIG. 6 shows an equivalent schematic diagram of output currents for a multiple-output comparator 600 according to an embodiment of the present invention. Multiple-output comparator 600 may be used as a comparator in a Benorion ADC. Multiple-output comparator 600 generates a primary output current (e.g., $I_{j0}$). Multiple-output comparator 600 includes a plurality of additional output currents (e.g., $I_{n1}$-$I_{nm}$, $I_{p1}$-$I_{pm}$). These additional output currents may be coupled with outputs from other individual comparators in a comparator string (e.g., in an ADC) to generate composite outputs. Additionally, primary output current $I_{j0}$ may combine with other additional outputs from other individual comparators in a comparator string to generate a composite output.

As shown in FIG. 6, some of the additional output currents may be positive currents and some additional outputs may be negative currents. The primary output current may be a combination of a positive and a negative current (e.g., $I_{p0}$ and $I_{n0}$ as shown in FIG. 6). When implemented in an ADC, the additional output currents ($I_{n1}$-$I_{nm}$, $I_{p1}$$I_{pm}$) may be operatively coupled with other output currents (e.g., other primary output currents, additional output currents from other comparators, or any combination thereof). These inter-coupled output currents may be summed with each other in order to generate a composite output current for each output code. For example, a positive current on one side of the composite output code is averaged by negative current on the other side of the composite output code.

Figure 7:
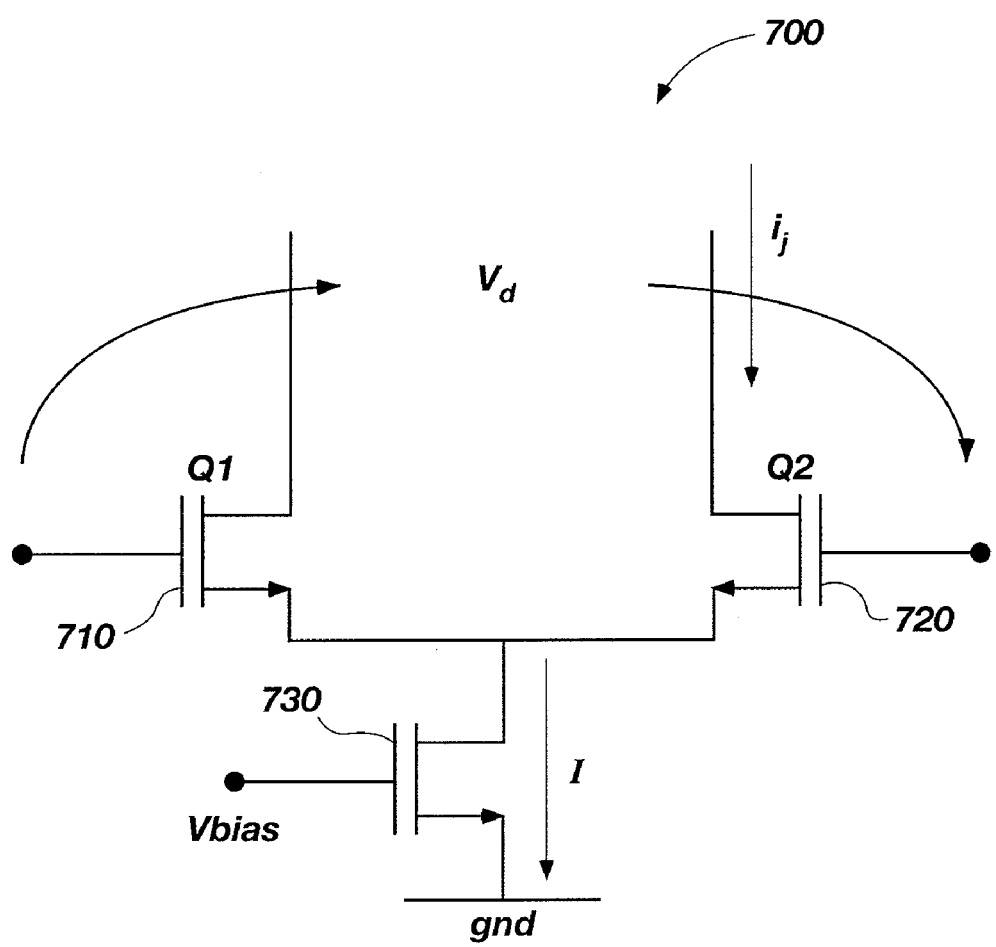
FIG. 7 illustrates a simplified differential amplifier which may be used in an ADC according to an embodiment of the present invention.

FIG. 7 illustrates a simplified differential amplifier 700, which may be used in an ADC according to an embodiment of the present invention. Simplified differential amplifier 700 may be used as a comparator in a comparator string of an ADC. Because amplifiers may be configured as comparators, the terms "amplifier" and "comparator" may be used interchangeably in this, and other embodiments. Simplified differential amplifier 700 includes a NMOS transistor 710 and a NMOS transistor 720 coupled to each other such that the sources of the NMOS transistor 710 and NMOS transistor 720 are coupled to each other. The sources of NMOS transistor 710 and NMOS 720 transistor are also coupled to the drain of a bias NMOS transistor 730. Simplified differential amplifier 700 may represent the j amplifier of an ADC which may generate an output drain current $I_j$.

For simplicity, cross-coupled outputs are not shown in FIG. 7 (e.g., multiple outputs from simplified differential amplifier 700, and outputs from other differential amplifiers in the ADC, which may be received by simplified differential amplifier 700). The number of cross-coupled outputs may be a function of the transistor geometry, process constants, matching, LSB size and operating current. The number of cross-coupled outputs may be approximated in the following analysis. If $I_j$ is the output drain current of the j amplifier in an amplifier according to an embodiment of the present invention, then $$I_j = k\{jVd/2 \pm [I/(2k) \pm (jVd/2)2]^{1/2}\}^2 \tag{5}$$

Assuming that $(Vd/2)^2 \ll I(2k)$, the drain current variance $[\sigma_j/\sigma]^2$ can be estimated for each amplifier to be approximately:

$$[\sigma_j/\sigma]^2 = [I_j/(2I)]^2 \approx 1/4 - (jVd/2)[k/(8I)]^{1/2} + (jVd/2)^2[k/(2I)] \tag{6}$$

where, $k = \mu p/nCox(W/L)/2$, Vd is the differential input voltage, I is the differential pair tail current, and j is the index of the amplifier within a comparator string. The standard deviation can be approximated as:

$$\sigma \approx A_{aP}/(WL)^{1/2} \tag{7}$$

In equation (7) $A_{aP}$ is Pelgrom's process mismatch constant.

If $Io_{composite}$ is the combined, cross-coupled output current of a single converter code (not shown in FIG. 7, see FIGS. 4A and 4B), the expected mean value of $Io_{composite}$ can be determined by summing the individual cross-coupled output currents from the neighboring amplifiers.

$$Io_{composite} = \Sigma I_j \text{ for } j=1 \text{ to } m, \text{ where m is the number of outputs} \tag{8}$$

$$Io_{composite}(m3/3)k(Vd/2)^2 \pm 4(m2/2)(Vd/2)(kI)^{1/2}mI/2 \tag{9}$$

The variance of the mean is:

$$\sigma^2_{mean} = \Sigma(\sigma j/m)^2 = \Sigma[I_j/(2mI)]^2 \text{ for } j=1 \text{ to } m \tag{10}$$

Therefore, the standard deviation of the mean is approximately:

$$\sigma_{mean} \approx [A_{aP}/(WL)^{1/2}]\{1/(2m)^2 \pm (Vd/2)[k/(2I)]^{1/2}/4 + (m/3)(Vd/2)^2[k/(2I)]\}^{1/2} \tag{11}$$

As an example, assuming m=6, I=10 nA, and the above process constants for a 0.18 µm×0.8 µm CMOS process, a sample calculation yields $\sigma_{mean}/I \approx \pm 10\%$ which indicates less than a ⅓ LSB distribution without missing codes.

The number of cross-coupled amplifier outputs may be uniform or non-uniform from one amplifier to another in the comparator string, as the case may be. One skilled in the art will recognize that any number of amplifier outputs may be used to cross-couple with other outputs in the comparator string, with the LSB distribution without error improving as the number of cross coupled amplifier outputs (m) approaches the total number of amplifiers in the comparator string. The adjacent neighbors may have the most impact on each other, and the impact from the outputs from amplifiers further away in the comparator string becomes more and more attenuated.

The number of cross-coupled amplifier outputs (m) may be determined by a second analytical method used to calculate the number of cross-coupled outputs (m) for each comparator by considering the point of diminishing return for the number of cross-coupled outputs (m) when generating a composite output. This second analytical method may not necessarily assure DNL success, but rather is an estimate for the effective number of cross-coupled outputs before the approximate point of diminishing return is reached for the number (m) of amplifier outputs. If it is assumed that $I_m = I/4$, greater values of m may offer little value due to the small relative current contribution.

Assuming again that $k = \mu p/nCox(W/L)/2$, Vd is the differential input voltage, I=diff pair tail current, and j is the index of the amplifier within a comparator string, the number of cross-coupled outputs, m, is approximately:

$$m = (1+\sqrt{3})^{1/2}/(2Vd) \tag{12}$$

For analysis, assume that the process constant values, $k_{NMOS} = 350$ µA/V2, for NMOS; 0.18 µm×0.8 µm; and $k_{PMOS} = 150$ µA/V2, for PMOS 0.18 µm×0.8 µm. It is noted that these process constant values may vary for different process technologies and are given as an example for analysis purposes, and not as a limitation to a specific process technology. With the above assumptions for an 0.18 µm×0.8 µm CMOS process, a sample calculation for the situation with a 10 nA tail current and with a 2 mV LSB yields 4 gm amp outputs (m=(1+√3)(10e−9/350e−6)½/(2*2e−3)), and 6 gm amplifier outputs (m=(1+√3/3)(10e−9/150e−6)½/(2*2e−3)). In other words, in this example the number of cross-coupled outputs (m) for each comparator may be about 4 when using NMOS transistors and about 6 when using PMOS transistors considering the diminishing return for increasing the number of cross-coupled outputs (m). These numbers may change depending on the characteristics of the transistors and the processes used.

FIGS. 8A-8D illustrate examples of comparators with a single input and multiple outputs according to an embodiment of the present invention. Such a comparator may be implemented as part of a Benorion ADC as is described herein. For example, comparator 800 of FIG. 8A includes a first comparator 810 including NMOS transistors 812, 814 configured as a differential amplifier. Comparator 800 further includes a second comparator 820 including PMOS transistors 822, 824 configured as a differential amplifier. A differential amplifier configuration may include two transistors (e.g., 812, 814) coupled such that the sources are operably coupled. The first comparator 810 and the second comparator 820 are operably coupled such that the gate of each receives an input signal (e.g., $V_{IN}$) and a voltage reference signal (e.g., $V_{REF}$) as inputs for comparing the input signal with the voltage reference signal to generate a differential amplifier output. The first comparator 810 may be operably coupled to a current mirror 830 that may include multiple stages for generating a series of outputs ($I_{P0}$-$I_{P3}$) responsive to the differential amplifier output. Likewise, second comparator 820 may be operably coupled to a current mirror 840 that may include multiple stages for generating a series of outputs ($I_{N0}$-$I_{N3}$) responsive to the differential amplifier output. Additionally, other transistors may be used as shown for power regulation, for holding (i.e., latching) certain signals, or for other reasons.

Figure 8A:
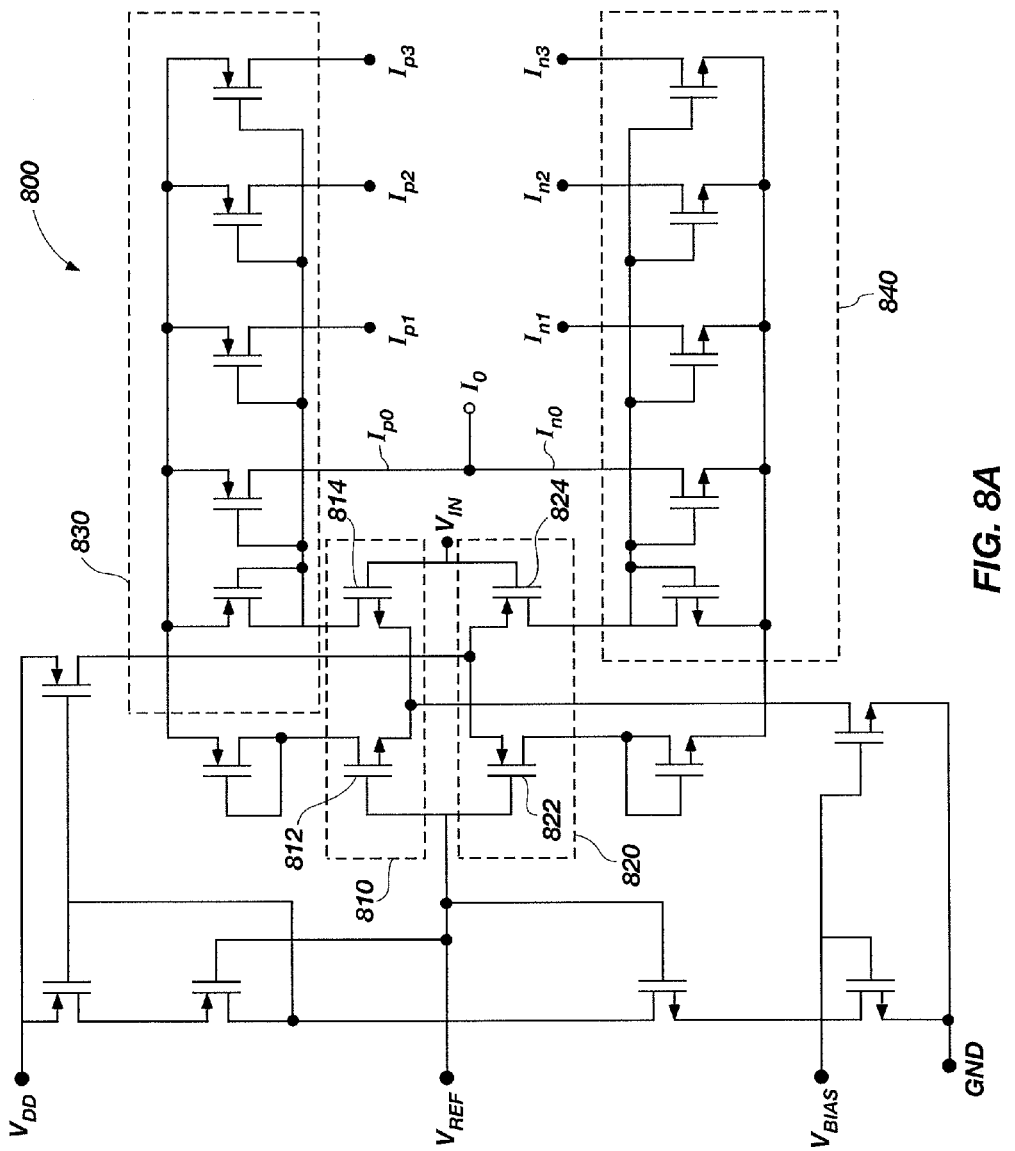
FIGS. 8A-8D illustrate various examples of comparators with a single input and multiple outputs according to an embodiment of the present invention.

The first set of outputs $I_{P0}$, $I_{N0}$ may combine to generate the primary output $T_o$ from the comparator 800 (see also, e.g., FIG. 6). The additional outputs ($I_{P1}$-$I_{P3}$, $I_{N1}$-$I_{N3}$) may couple with outputs from other individual comparators in a comparator string (e.g., in an ADC) to form composite outputs (see, e.g., FIG. 4A). Additionally, primary output current $I_o$ may combine with other additional outputs from other individual comparators in a comparator string to generate a composite output for the particular code associated with comparator 800. The comparator 800 of FIG. 8A shows three additional outputs ($I_{P1}$-$I_{P3}$, $I_{N1}$-$I_{N3}$); however, more or fewer additional outputs ($I_{P1}$-$I_{P3}$, $I_{N1}$-$I_{N3}$) may exist based on designer preference, the point of diminishing returns, or other relevant factors. To illustrate this point, that the number of additional outputs may vary, FIGS. 8B-8D list additional outputs as $I_{P1}$-$I_{PM}$, and $I_{N1}$-$I_{NM}$, where "$M$" is an index reference number indicating the number of additional outputs.

As was discussed in FIG. 6, some of the additional outputs may be positive currents (e.g., $I_{P1}$-$I_{P3}$) and some additional outputs may be negative currents (e.g., $I_{N1}$-$I_{N3}$). Positive and negative currents may be defined as such in relation to one another and based on a reference direction for current flow, and not necessarily as a particular direction of flowing electrons. When implemented in an ADC, the additional output currents are operatively coupled with other output currents from other comparators (such as primary output currents, other additional output currents, or any combination thereof). These output currents may be summed (which also may be referred to as averaged) with each other in order to generate a composite output for each output code. For example, a positive current on one side of the composite output code is averaged by negative current on the other side of the composite output code.

It is noted that the relative strength of the current for the additional outputs ($I_{Pi}$-$I_{P3}$, $I_{N1}$-$I_{N3}$) of an individual comparator (e.g., comparator 800) may have a substantially equal current strength relative to each other. In addition, the additional outputs ($I_{P1}$-$I_{P3}$, $I_{N1}$-$I_{N3}$) of an individual comparator may be substantially equal in strength as the individual outputs ($I_{P0}$, $I_{N0}$) forming the primary output ($J_o$). For example, output currents ($I_{P0}$-$I_{P3}$) may be substantially equal with each other. Likewise, output currents ($I_{N0}$-$I_{N3}$) may be substantially equal with each other. However, as a reminder, it is noted that when implemented in an ADC with a plurality of individual comparators, the relative strength from adjacent comparator outputs may be a function of the analog input voltage and the position of the code related to the voltage reference signals. In other words, the additional outputs from closely neighboring comparators in the comparator string may have a stronger influence over a composite output than the additional outputs from more distant comparators in the comparator string (refer to the discussion regarding the point of diminishing returns).

Figure 8B:
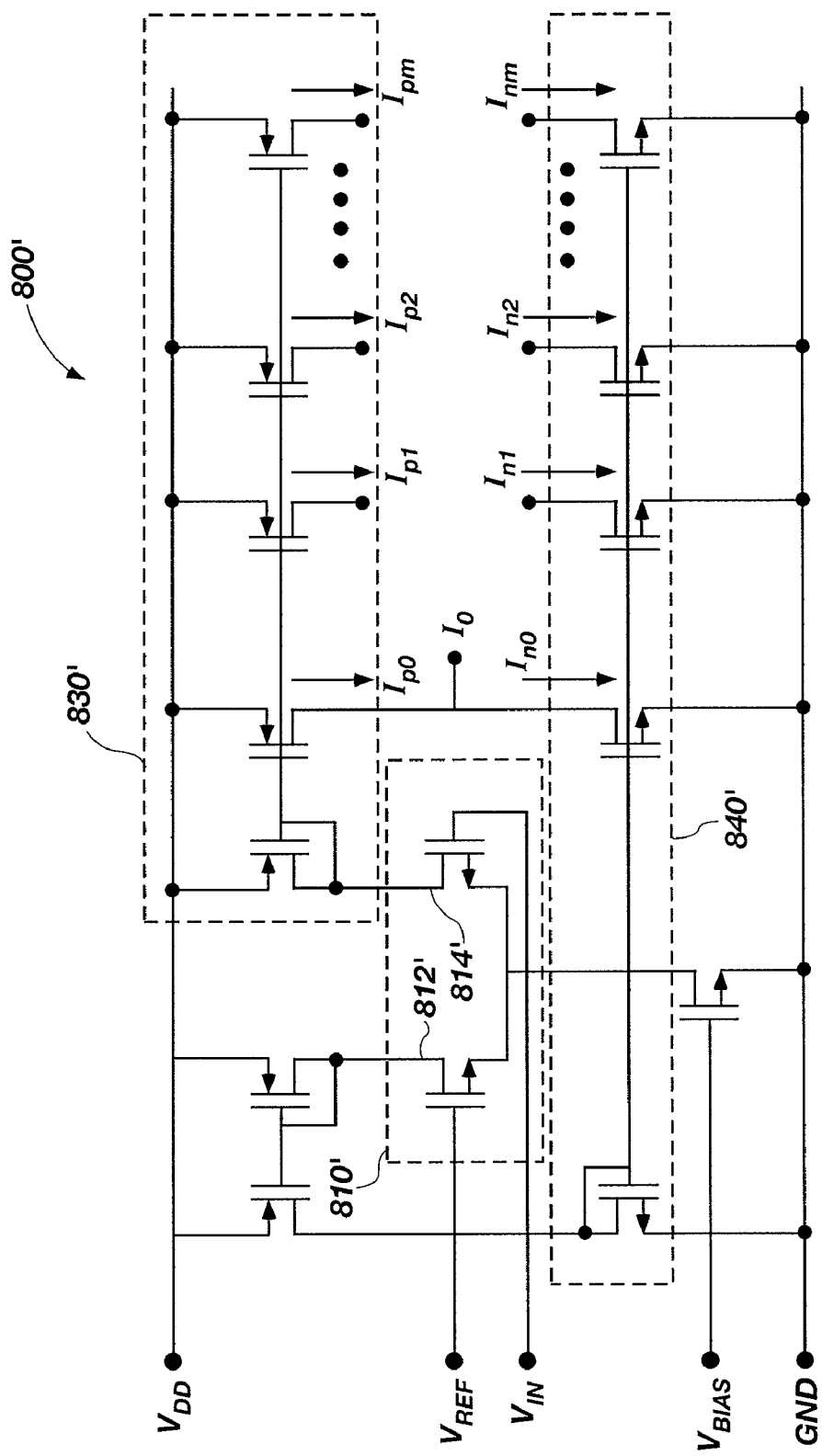
Figure 8C:
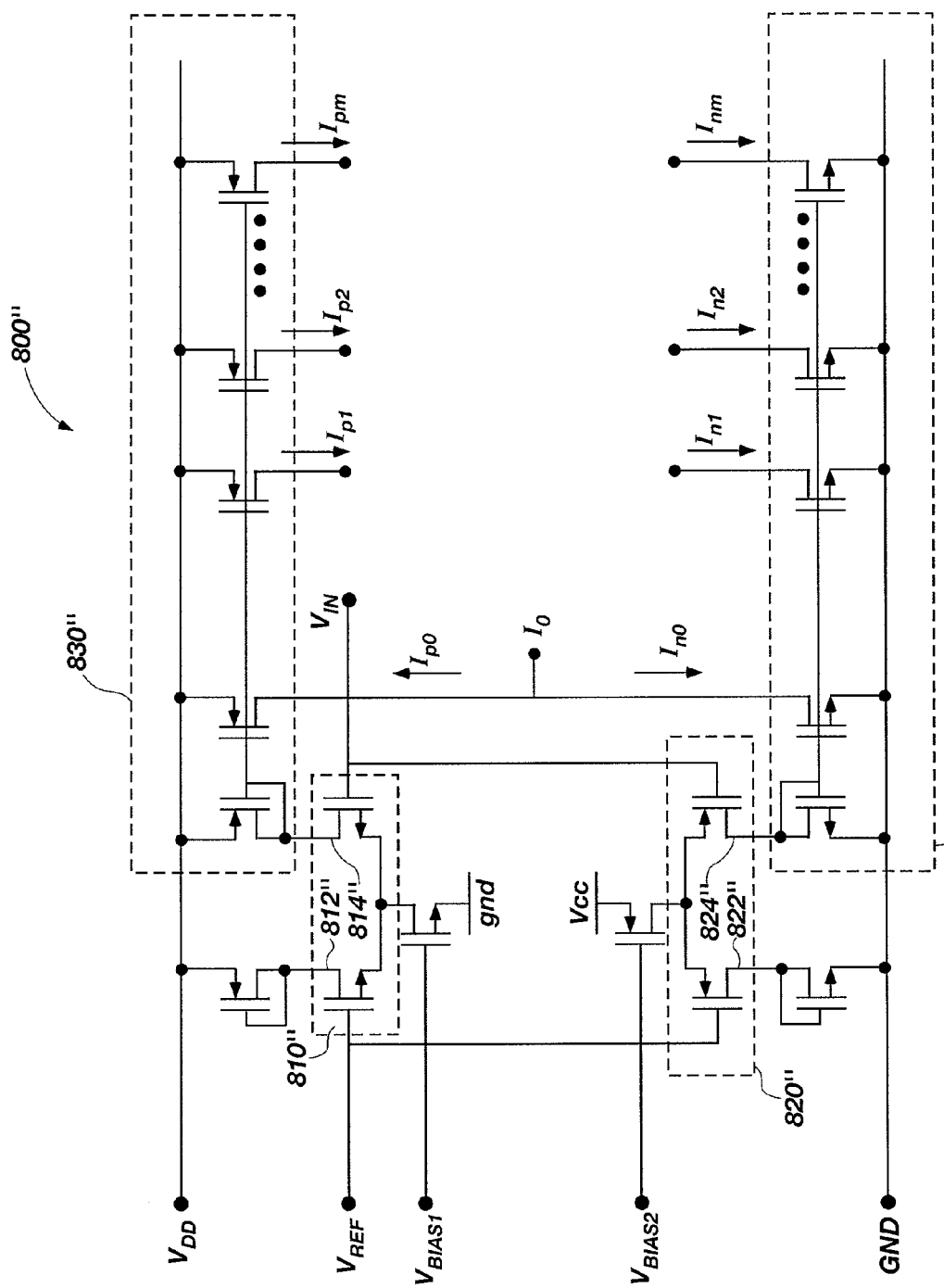
Figure 8D:
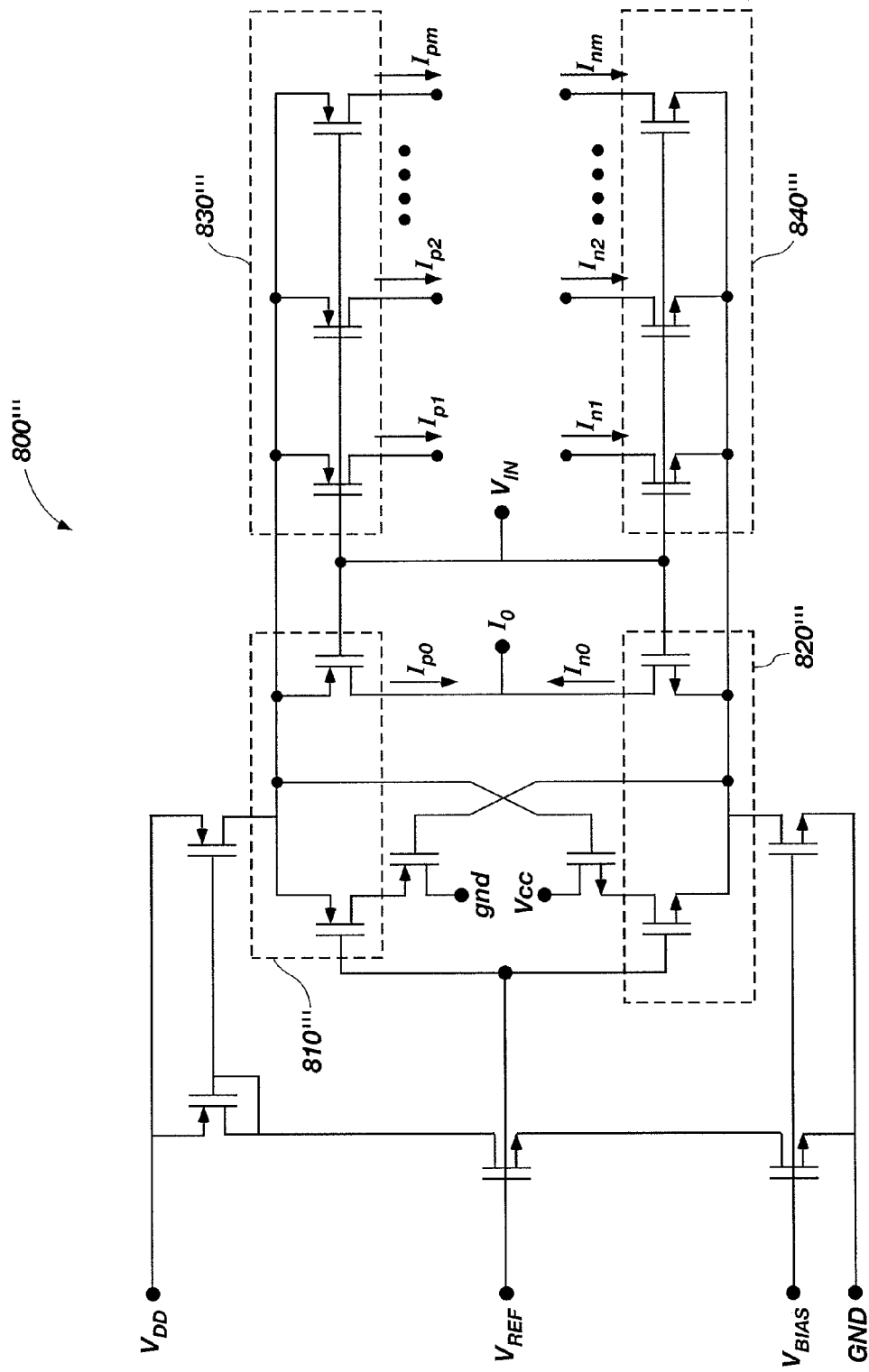

Although various specific configurations for comparators are shown herein, many different configurations are possible for a single input, multiple output comparator. Examples of such configurations are shown in FIGS. 8B-8D as comparators 800', 800", and 800'". Similar elements in FIGS. 8B-8D related to those in FIG. 8A are indicated with like numbers and a corresponding prime number notation (e.g., 810', 810", and 810'" for first comparators with transistors configured as differential amplifiers) according to the respective figure. As shown in these additional exemplary configurations, there may be a different number of comparators configured as differential amplifiers. For example, FIG. 8B shows one configuration of a comparator 800' with only a first comparator 810'. Additionally, more than one bias voltage may exist (e.g., FIG. 8C show bias voltage signals $V_{BIAS1}$, $V_{BIAS2}$ coupled with first and second comparators 810", 820").

Even more configurations for comparators may also be possible than those shown in FIGS. 8A-8D. These additional configurations may range from simple to complex in terms of the number of components used. Each configuration may have its own unique characteristics making it useful to particular application requirements (e.g., differences in timing symmetry). If implemented in an ADC, the multiple output currents are operatively coupled and summed with each other in order to generate a composite output for each output code. Positive current on one side of the composite output code is averaged by negative current on the other side of the composite output code.

Embodiments of the invention illustrated herein have shown comparators and ADCs using CMOS processes because of the unique advantages that using CMOS transistors have over conventional ADCs. However, embodiments of the present invention may also include other transistors and processes, such as BJT and gallium-arsenide processes. Embodiments including BJT or gallium-arsenide processes may be desirable for relatively small LSBs such that the composite output codes would be close together.

Once the analog input signal V is processed through a first stage of a comparator string of comparators with cross-coupled outputs to generate a quasi-digital current output, the voltage gain might generally be approximated as:

$$Av = gm_{1,2}(r_p \| r_n) = \sqrt{(2/I)}\sqrt{k}/(\lambda_n + \lambda_p) \tag{13}$$

In equation (13), k is about ½ μCoxW/L and μ is the CMOS channel length modulation factor. Additional voltage gain may be necessary to achieve sufficient digital characteristics. Therefore, at least one additional stage may be required. The at least one additional stage may also require further cross-coupled outputs to compensate for mismatch in the second stage amplifiers. The following figures illustrate examples of additional stages, which may be used in embodiments of the present invention.

Figure 9A:
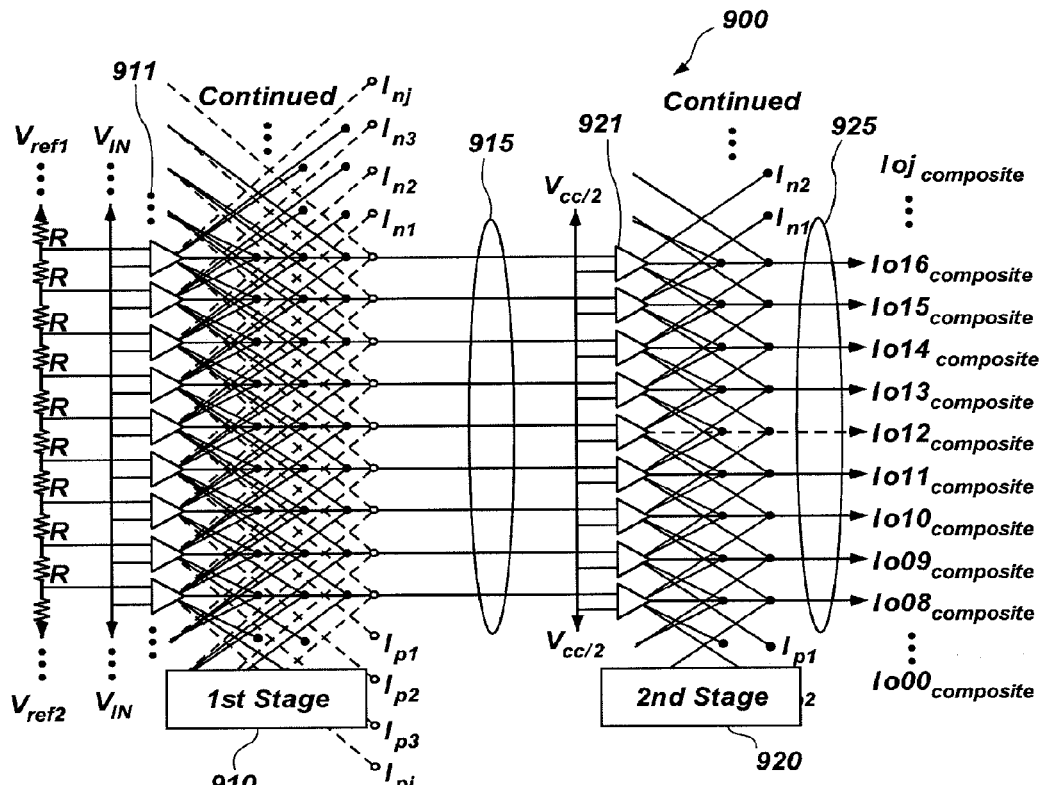
FIGS. 9A and 9B illustrate an analog-to-digital converter with a plurality of stages, and the outputs of the plurality of stages according to an embodiment of the present invention.
Figure 9B:
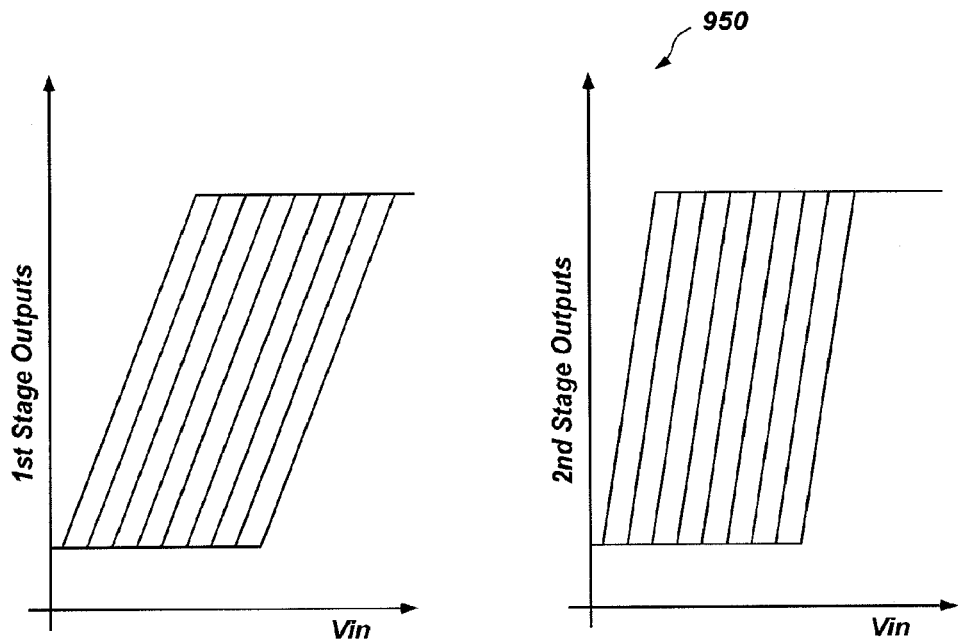

FIGS. 9A and 9B illustrate an analog-to-digital converter 900 with a plurality of stages, and outputs 950 of the plurality of stages according to an embodiment of the present invention. As previously stated, additional voltage gain may be necessary to achieve sufficient digital characteristics. Additional stages may also be implemented for other reasons, such as, for example if there is enough mismatch within the transistors such that there is still an undesirable lack of monotonistic behavior of the bits in the output line coming out of the of a first stage 910. A second stage 920 may be operably coupled to the output of the first stage 910.

In FIG. 9A the first stage 910 includes a comparator string 911 including a plurality of single input, multiple-output comparators. The outputs of the comparators of the comparator string 911 are cross-coupled with adjacent comparator outputs to generate a first set of composite outputs 915. The first set of composite outputs 915 may then be input into a second comparator string 921 of the second stage 920. The second stage 920 may also include a second comparator string 921 including a second plurality of single input, multiple-output comparators. The second comparator string 921 may be configured to compare the first set of composite outputs 911 and a voltage reference (e.g., Vcc/2 as one possible voltage reference value). In the second stage 920, the voltage reference (e.g., Vcc/2) may be a constant voltage rather than a series of voltages that vary from one individual comparator to the next. In FIG. 9, the second stage 920 is configured for generating a second set of composite outputs 925 comprising outputs of individual comparators of the second comparator string 921 coupled with at least one other output of another individual comparator of the second comparator string 921. The second stage 920 may compensate for mismatch that still exists in the first stage 910 and/or add gain to the outputs.

FIG. 9B is a graph illustrating first stage outputs and second stage outputs of the ADC illustrated in FIG. 9A according to an embodiment of the present invention. As previously mentioned, adding an additional stage may add gain to the outputs causing the transitions to be more vertical as illustrated in FIG. 9B when comparing the slope of the transitions of the second stage outputs relative to the first stage outputs. Adding additional stages may also increase averaging and, as a result, may further reduce misplaced codes.

Figure 10:
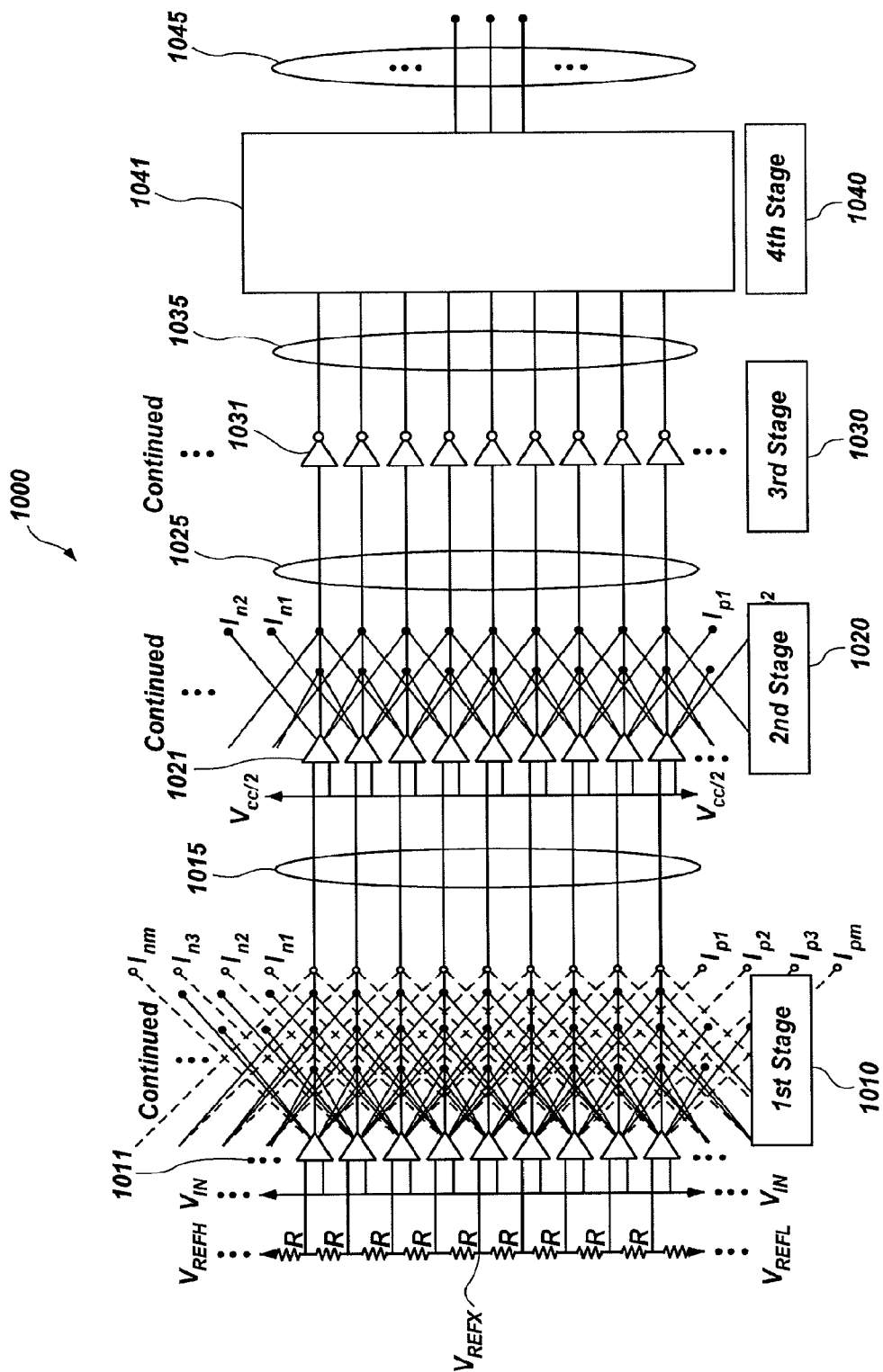
FIG. 10 illustrates an analog-to-digital converter with a plurality of stages.

FIG. 10 illustrates an analog-to-digital converter 1000 with a plurality of stages. Analog-to-digital converter 1000 includes a first stage 1010, second stage 1020, third stage 1030 and a fourth stage 1040. The first stage 1010 is operably coupled with the second stage 1020 such that the outputs from the first stage 1010 are inputs to the second stage 1020. The second stage 1020 and the third stage 1030 are operably coupled such that the outputs from the second stage 1020 are inputs to the third stage 1030. The third stage 1030 and fourth stage 1040 are operably coupled such that the outputs from the third stage 1030 are inputs to the fourth stage 1040.

The first stage 1010 includes a comparator string 1011 including a plurality of comparators. The plurality of comparators are operably coupled for receiving an analog input signal ($V_{IN}$) and configured for comparing $V_{IN}$ with a plurality of voltage reference signals ($V_{REFX}$). As used before, "x" is an index referring to a specific voltage reference signal for an individual comparator in the comparator string 1011. The first stage 1010 further includes a plurality of composite outputs 1015 comprising outputs of individual comparators of the plurality of comparators that are coupled with at least one other output of another individual comparator of the comparator string 1011.

The second stage 1020 includes a second comparator string 1021 including a second plurality of comparators operably coupled for receiving the plurality of composite outputs 1015. The individual comparators of the second comparator string 1021 may be configured to compare the composite outputs 1011 and a voltage reference (e.g., Vcc/2 as one possible voltage reference value). In the second stage 1020, the voltage reference (e.g., Vcc/2) may be a constant voltage rather than a series of voltages that vary from one individual comparator to the next. In FIG. 10, the second stage 1020 is configured for generating a second plurality of composite outputs 1025 comprising outputs of individual comparators of the second comparator string 1021 coupled with at least one other output of another individual comparator of the second comparator string 1021. The second stage 1020 may compensate for for a mismatch that still exists in the first stage 1010, and/or add gain to the outputs.

The third stage 1030 is shown to be a plurality of digital buffer inverters 1031, which may individually be configured in a manner known in the art. Of course, in some embodiments, the buffers may be configured as non-inverting buffers. The fourth stage 1040 is shown to include a decoder 1041 configured to convert a signal (e.g., third stage outputs 1035) into a digital output signal 1045 (e.g., binary code). Although the different stages are shown in FIG. 10 to include specific configurations, the multiple stages may include different combinations of stages. For example, the second stage 1020 may include a plurality of digital buffer inverters 1031. Further, some stages may be even further duplicated and/or eliminated.

FIGS. 11-15 illustrate simulation results for analog-to-digital converters according to various embodiments of the present invention. Each of these simulations included a Benorion ADC with various stages using a sub-micron CMOS process with 0.18 μm×0.8 μm minimum geometry transistors. Although the following examples are simulated on a 180 nm CMOS process, other processes (e.g., 65 nm, etc.) may be used for embodiments of the invention as well.

Figure 11:
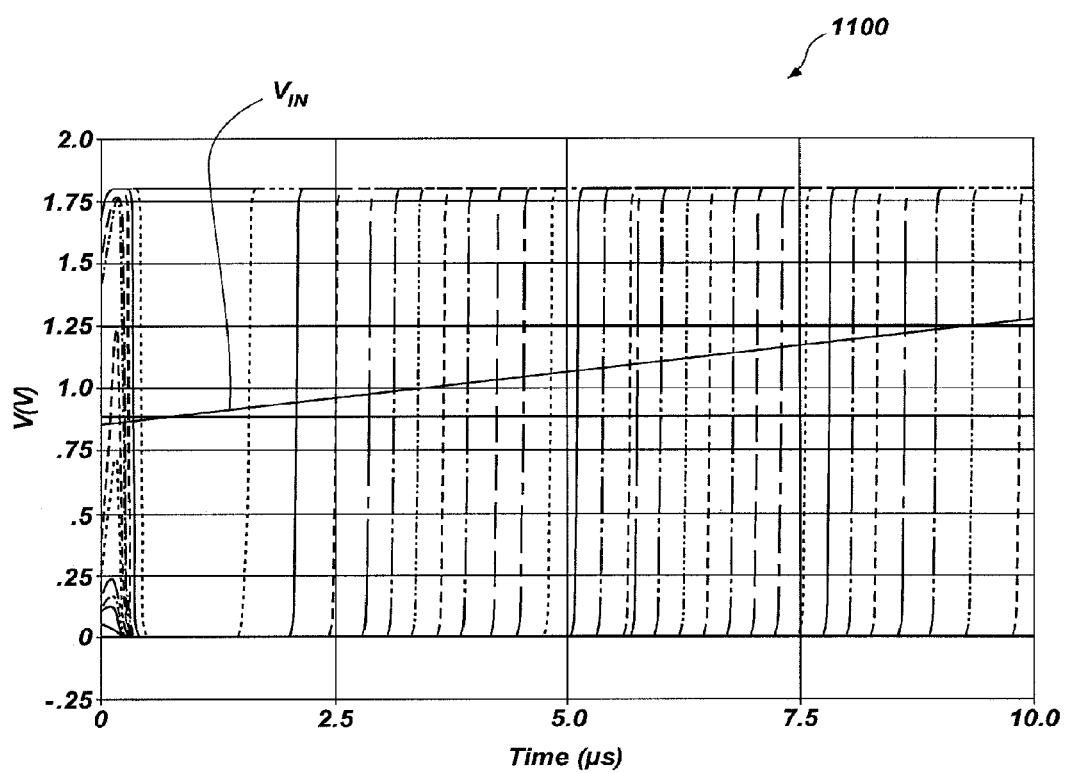
FIG. 11 shows a graph representing simulated results from a 5-bit analog-to-digital converter with three stages according to an embodiment of the present invention.

FIG. 11 shows a graph 1100 representing simulated results from a 5-bit analog-to-digital converter with three stages according to an embodiment of the present invention. A resolution of five bits is illustrated as an example, as the resolution may be higher or lower, as the case may be. The output shown in FIG. 11 is the simulated result after a third stage of a three-stage ADC converter. Adding two additional stages may add voltage gain to the output signal, which may result in a steeper slope for the transitions shown in graph 1100.

Figure 12:
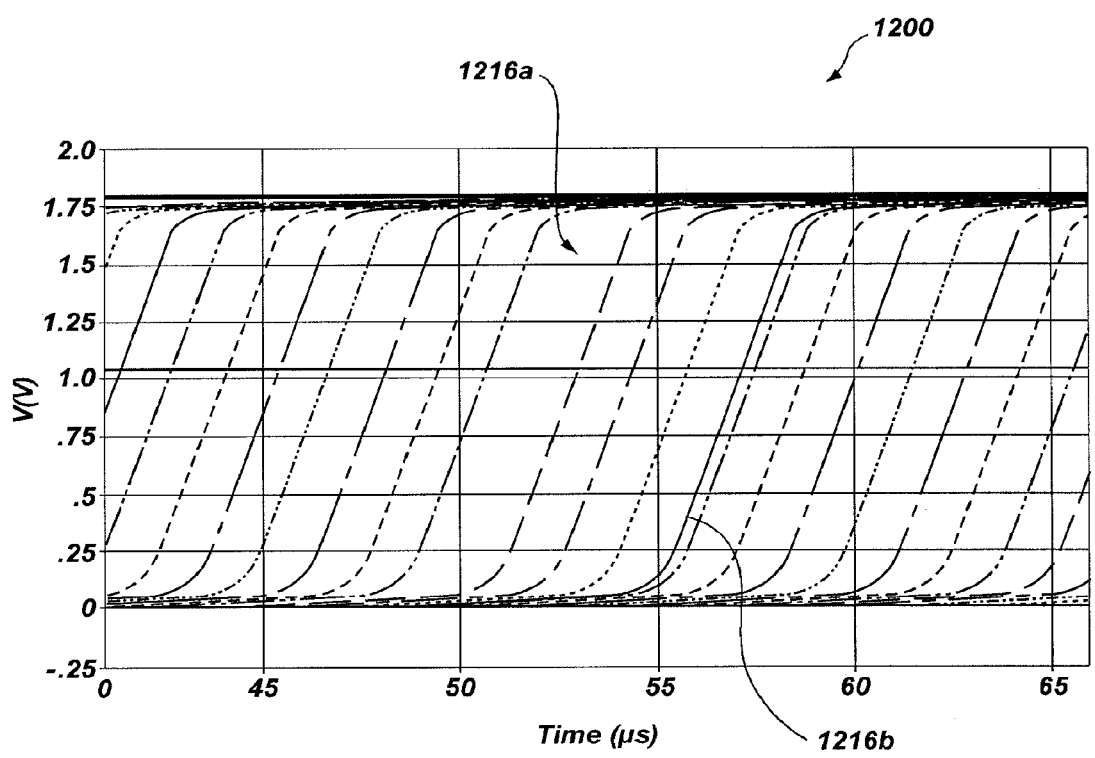
FIG. 12 shows a graph illustrating the simulated output of the first stage of a G-bit ADC with a forced comparator mismatch according to an embodiment of the present invention.
Figure 13:
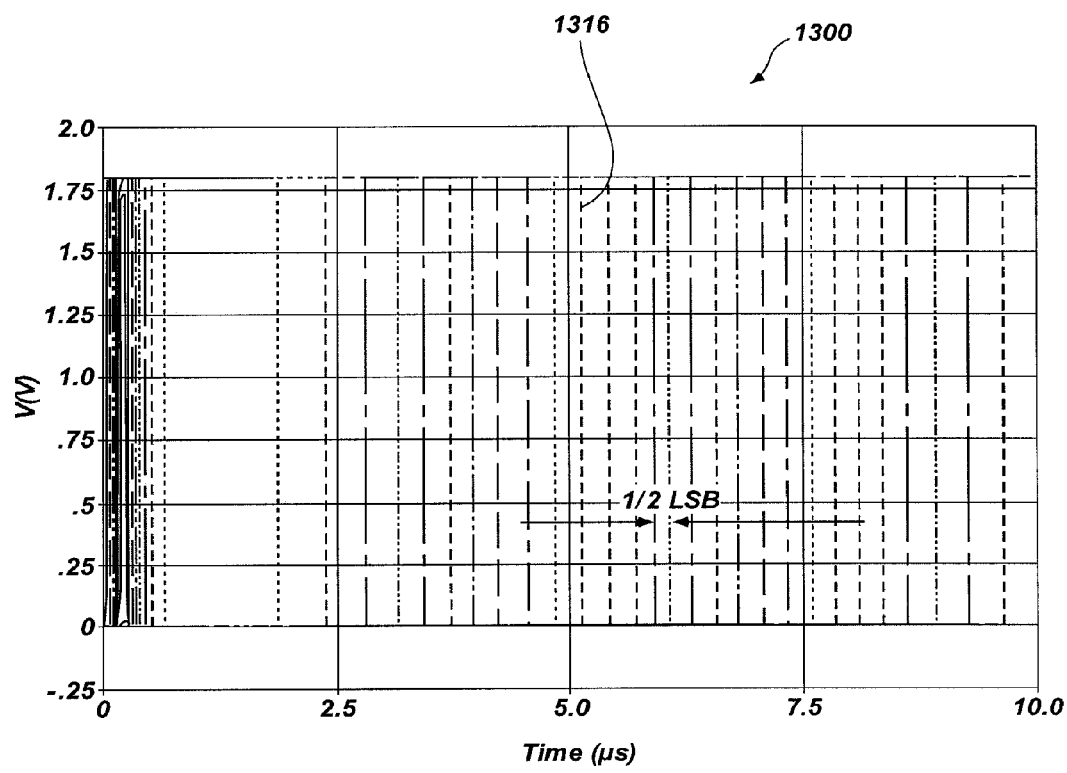
FIG. 13 shows a graph illustrating the simulated output at the fourth stage of a four-stage ADC according to an embodiment of the present invention.

In FIG. 11, two horizontal lines are shown at about 1.26V and 0.9V. These horizontal lines represent the high and low voltage reference signals $V_{REFH}$ and $V_{REFL}$, respectively. As previously stated, intermediate voltage references are input to the comparator string. Intermediate voltage references may be generated by a resistor string, or by other resistor or circuit configurations. In this example, a resistor string divided the voltage range between $V_{REFH}$ and $V_{REFL}$ into 32 ($2^5$ for a five bit resolution) different intermediate voltage references (i.e., LSBs, not shown in FIG. 11) for comparison to the analog input voltage signal $V_{IN}$. For the simulation shown in FIG. 11 (and each of the following simulations shown in FIGS. 12-13) analog input voltage signal $V_{IN}$ was used in this simulation as a transient analysis voltage sweep. A voltage sweep increases an input signal a certain number of volts for a period of time (e.g., microseconds), which is the reason that the dimension of the x-axis for each of FIGS. 11-13 is in microseconds. As a result, analog input voltage signal $V_{IN}$ is shown in the plot as a diagonal line increasing from about 0.8V to about 1.3V.

What is not shown in FIG. 11 is that there is a horizontal voltage threshold for the voltage level of each LSB (i.e., difference between adjacent voltage reference signals between $V_{REFH}$ and $V_{REFL}$) in the comparator string. As $V_{IN}$ increases to a voltage level above a voltage threshold for a particular LSB, the corresponding outputs for each affected comparator transitions from low to high. In other words, in a voltage sweep analysis, as the analog input voltage signal $V_{IN}$ passes through each ladder threshold, the expected output should switch in a sequential, thermometer-type output ordered from a digital low output signal to a digital high output signal. In FIG. 11 each of the substantially vertical lines that start at 0 V and transition to 1.8 V are the individual output codes from each individual comparator of the comparator string of the ADC converter. These outputs can then be decoded into binary if desired, and/or processed as desired by a particular application.

FIG. 12 shows a graph 1200 illustrating the simulated output of the first stage of a 6-bit ADC with a forced comparator mismatch according to an embodiment of the present invention. In this particular simulation, the input comparator for code 16 was forced to have a relatively large mismatch of 3:1 to show the effect of mismatch on DNL. This forced comparator mismatch is shown by code 16 indicated by line 1216b being shifted to the right from location 1216a, where code 16 would be located without the forced mismatch. In each of these graphs, DNL can be viewed by the horizontal spacing between the output codes on the graphs. It is noted that DNL remains less than 1 LSB and there are no missing codes. Another item to note in FIG. 12 is that this simulation represents the output of the first stage. As the output signals are of the first stage, the transitions may appear less vertical than some of the graphs of some of the other simulations, which include output of an ADC with multiple stages.

FIG. 13 shows a graph 1300 illustrating the simulated output at the fourth stage of a four-stage ADC according to an embodiment of the present invention. A fourth stage may include a component (e.g., decoder) that converts the code into a digital signal for further analysis or processing. In this particular simulation, the input comparator for code 16 (represented by line 1316) was forced to have a relatively large 300 mV voltage offset in order to show the effect of differential non-linearity with such a voltage offset. As shown in FIG. 13, the DNL remains less than 1 LSB without any missing codes.

Figure 14:
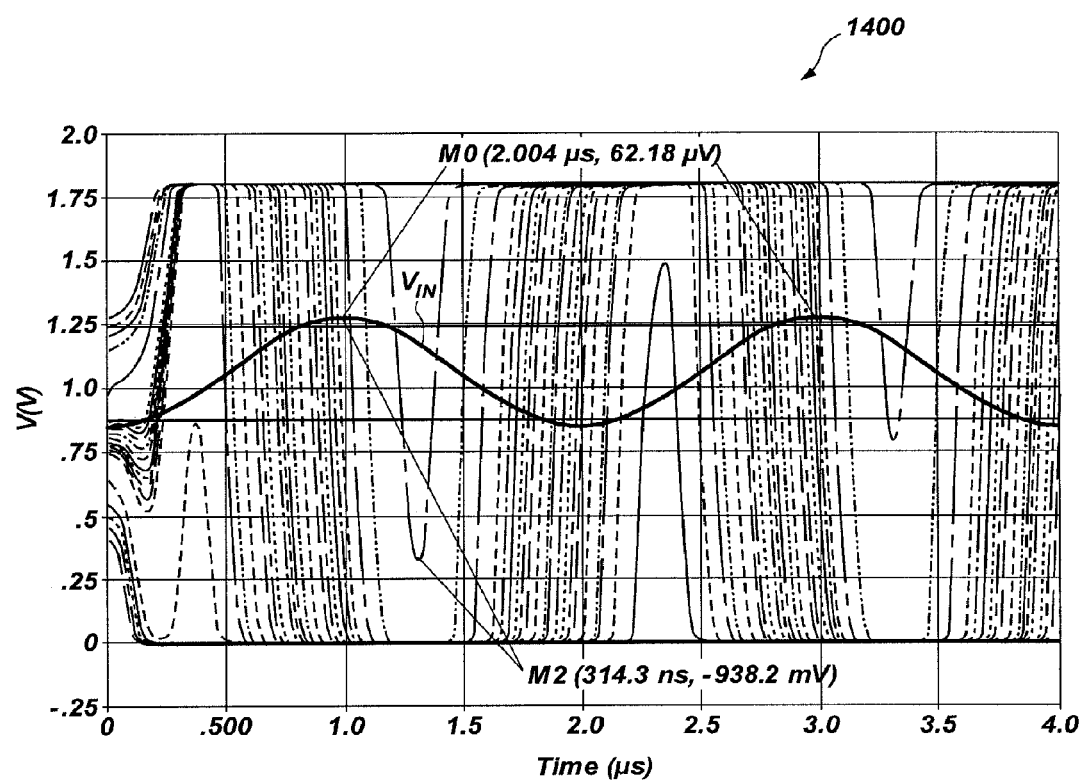
FIG. 14 shows a graph illustrating the simulated output transitions when a 5-bit, three-stage converter is stimulated with a 500 kHz input voltage according to an embodiment of the present invention.

FIG. 14 shows a graph 1400 illustrating the simulated output transitions when a 5-bit, three-stage converter is stimulated with a 500 kHz input voltage ($V_{IN}$) according to an embodiment of the present invention. As $V_{IN}$ moves through the different thresholds created by voltage reference signals, the outputs of the comparators transition from low to high. As shown in FIG. 14, there is some delay (i.e., lag) from when the $V_{IN}$ passes through a threshold and when the corresponding output is generated. As shown in FIG. 14, there are about 56 degrees of phase shift at 500 kHz and 5 mW of power dissipation.

Figure 15:
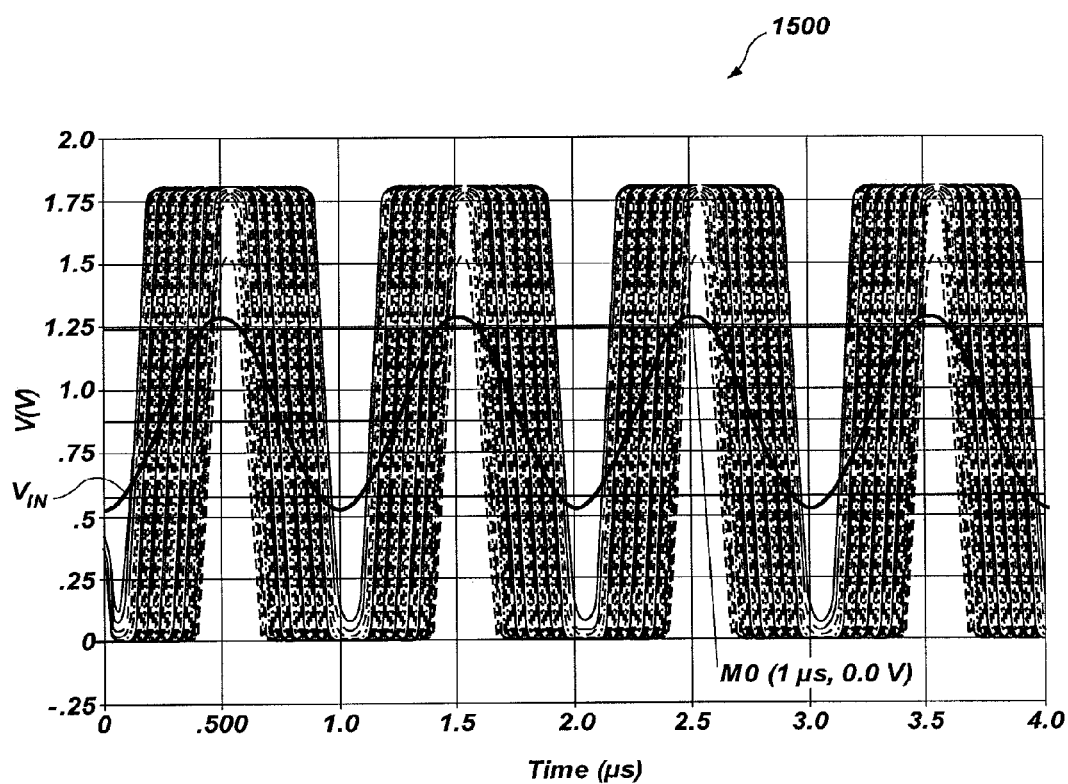
FIG. 15 shows a graph illustrating the simulated output transitions when a 6-bit ADC converter at is simulated with a 1 MHz input voltage consuming 54 µW according to an embodiment of the present invention.

FIG. 15 shows a graph 1500 illustrating the simulated output transitions when a 6-bit ADC is simulated with a 1 MHz input voltage ($V_{IN}$) consuming 54 µW according to an embodiment of the present invention. In FIG. 15, there is shown about 10 degrees of phase shift. Thus, the ADC converter is stable in FIGS. 14 and 15 if implemented in a control loop with such parameters.

It is further noted that the end stage of a Benorion ADC may include unaveraged ends as has been described herein. Additionally, it is noted that it may be desirable to extend the number of individual comparators beyond that which is conventionally required for a given resolution. In other words, an 8-bit converter may have more than 256 comparators so that the ends will have other comparator outputs to average with. Several other termination methods are also possible which are appreciated by the inventor and which will be appreciated by those of ordinary skill in the art after reading the present disclosure, each termination method with its own set of advantages and disadvantages. The termination methods described herein are to be seen as examples only, and not as a limitation herein.

A new analog-to-digital conversion method and ADC, called a Benorion Converter or Benorion ADC, has been designed and demonstrated herein that achieves a similarly fast conversion rate of a conventional bipolar flash converter. The Benorion ADC may have additional advantages, which may include at least one of reduced power dissipation, reduced silicon area consumption, similarly equivalent differential non-linearity, and reduced input capacitances. The Benorion ADC may further outperform other ADC methods for particularly desirable parameters including at least one of low power dissipation, small die size, high conversion rate, low conversion delay, differential non-linearity. For example, embodiments of the present invention may be used in applications in which one or more parameters such as relatively fast conversion rate (i.e., short latency), monotonic output, low cost, low input bias current, low input capacitance and low power dissipation may be desirable. Among the wide variety of applications in which such an ADC may be desirable, one specific example of such may include digital control loops, which may require relatively fast conversion rates and low power consumption, especially when part of a battery-powered portable device (e.g., cell phones, digital cameras, audio/video players, personal digital assistants, etc.). Other applications may include baseband applications, among many other applications.

While the present invention has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An analog-to-digital converter, comprising:
a plurality of comparators operably coupled for receiving an analog input signal and configured for comparing the analog input signal with a plurality of voltage reference signals, wherein each of the plurality of comparators comprises:
a positive current mirror configured to generate at least one positive current output;
a negative current mirror configured to generate at least one negative current output; and
a primary comparator output that includes a combination of the at least one positive current output and the at least one negative current output; and
a plurality of composite outputs, each composite output of the plurality comprising a combination of the primary comparator output from a corresponding comparator of the plurality and at least one additional current output from at least one additional comparator of the plurality of comparators.

2. The analog-to-digital converter of claim 1, further comprising a resistor string including a plurality of resistors coupled in series, wherein the plurality of voltage reference signals are generated at nodes between individual resistors of the resistor string.

3. The analog-to-digital converter of claim 1, wherein each composite output of the plurality comprises the primary comparator outputs cross coupled with current outputs of neighboring comparators of the plurality of comparators.

4. The analog-to-digital converter of claim 1, wherein the plurality of comparators include CMOS transistors.

5. The analog-to-digital converter of claim 1, wherein the plurality of comparators include transistors selected from the group consisting of bipolar junction transistors and gallium arsenide process transistors.

6. The analog-to-digital converter of claim 1, wherein each of the plurality of comparators further comprises:
at least one differential amplifier configured to compare the analog input signal with a corresponding one of the plurality of voltage reference signals to generate a positive current to the positive current mirror, and a negative current to the negative current mirror.

7. The analog-to-digital converter of claim 6, further comprising a bias gate coupled to the at least one differential amplifier, wherein the bias gate is coupled to a bias signal.

8. The analog-to-digital converter of claim 1, further comprising at least one additional stage for processing the plurality of composite outputs.

9. The analog-to-digital converter of claim 8, wherein the at least one additional stage for processing the plurality of composite outputs is configured to amplify a voltage gain of the plurality of composite outputs.

10. The analog-to-digital converter of claim 8, wherein the at least one additional stage comprises:
a second plurality of second comparators operably coupled for receiving the plurality of composite outputs wherein each second comparator is configured for generating a plurality of second comparator outputs responsive to a comparison of a common reference signal and a corresponding composite output of the plurality; and
a plurality of second composite outputs, each second composite output of the plurality comprising a combination of a second comparator output from a corresponding second comparator of the plurality and a second comparator output from at least one other comparator output of another individual second comparator of the plurality.

11. The analog-to-digital converter of claim 8, wherein the at least one additional stage is a plurality of buffers.

12. The analog-to-digital converter of claim 8, wherein the at least one additional stage is a decoder operably coupled to the plurality of composite outputs, wherein the decoder is configured to convert the plurality of composite outputs into a digital output signal.

13. The analog-to-digital converter of claim 1, wherein each of the plurality of comparators comprises:
    a first differential amplifier configured to generate a positive current to the positive current mirror responsive to a voltage difference between an analog input signal and a corresponding one of the plurality of voltage reference signals; and
    a second differential amplifier configured to generate a negative current to the negative current mirror responsive to the voltage difference.

14. The analog-to-digital converter of claim 13, further comprising:
    a first bias gate coupled to the first differential amplifier, wherein the first bias gate is coupled to a first bias signal; and
    a second bias gate coupled to the second differential amplifier, wherein the second bias gate is coupled to a second bias signal.

15. The analog-to-digital converter of claim 13, further comprising:
    a first bias gate coupled to the first differential amplifier, wherein the first bias gate is coupled to a first bias signal; and
    a second bias gate coupled to the second differential amplifier, wherein the second bias gate is coupled to a second bias signal.

16. The analog-to-digital converter of claim 1, wherein the analog input signal is coupled to at least one gate of the positive current mirror and at least one gate of the negative current mirror.

17. A comparator for comparing two input signals, the comparator comprising:
    a first input line operably coupled to a first transistor;
    a second input line operably coupled with a second transistor;
    at least one positive current mirror configured to generate a plurality of positive output currents in response to a voltage difference of the first input line and the second input line;
    at least one negative current mirror configured to generate a plurality of negative output currents in response to the voltage difference; and
    a composite output that includes a summation of:
        at least one positive output current from the at least one positive current mirror; and
        at least one negative output current from the at least one negative current mirror.

18. The comparator of claim 17, wherein the first transistor and the second transistor are CMOS transistors.

19. The comparator of claim 17, wherein:
    the plurality of positive output currents have a substantially equal relative current strength; and
    the plurality of negative output currents have a substantially equal relative current strength.

20. The comparator of claim 19, wherein the first transistor and the second transistor are configured as a differential amplifier for comparing voltages from the first input line and the second input line to generate a differential amplifier output, wherein the at least one positive current mirror and the at least one negative current mirror are respectively configured to generate the plurality of positive output currents and the plurality of negative output currents in response to the differential amplifier output.

21. A method for converting an analog signal to a digital signal, the method comprising:
    comparing an analog input signal with a plurality of voltage reference signals to generate a positive current outputs and a plurality of negative current outputs corresponding to individual comparators of a plurality of comparators;
    generating a plurality of primary output signals for each individual comparator of the plurality of comparators that includes a contribution from at least one positive current output and at least one negative current output corresponding to the individual comparator;
    summing individual primary output signals corresponding to the individual comparators with at least one of another positive current output and another negative current output from another individual comparator of the plurality to generate a plurality of composite output signals.

22. The method of claim 21, further comprising decoding the plurality of composite output signals to generate a digital output signal.

23. The method of claim 21, further comprising:
    comparing the plurality of composite output signals with a common reference signal to generate a second plurality of primary output signals and a second plurality of additional output signals; and
    summing individual output signals of the second plurality of primary output signals with other additional output signals of the second plurality of additional output signals; and
    generating a second plurality of composite output signals responsive to the summing of individual output signals of the second plurality of primary output signals with other additional output signals of the second plurality of additional output signals.

24. The method of claim 21, further comprising increasing a voltage gain of the plurality of composite output signals.

* * * * *